United States Patent [19]
Amagai

[11] Patent Number: 5,986,335
[45] Date of Patent: Nov. 16, 1999

[54] SEMICONDUCTOR DEVICE HAVING A TAPELESS MOUNTING

[75] Inventor: Masazumi Amagai, Beppu, Japan

[73] Assignee: Texas Instruments Incorporated, Dallas, Tex.

[21] Appl. No.: 08/757,777

[22] Filed: Nov. 27, 1996

[30] Foreign Application Priority Data

Dec. 1, 1995 [JP] Japan ................................ 7-337927

[51] Int. Cl.[6] .............................................. H01L 23/495
[52] U.S. Cl. ...................... 257/668; 257/666; 257/669; 257/674
[58] Field of Search .................................. 257/666, 668, 257/669, 674

[56] References Cited

U.S. PATENT DOCUMENTS

| | | | |
|---|---|---|---|
| 4,811,081 | 3/1989 | Lyden | 257/668 |
| 5,206,536 | 4/1993 | Lim | 257/668 |
| 5,227,232 | 7/1993 | Lim | 428/344 |
| 5,261,156 | 11/1993 | Mase et al. | 29/832 |
| 5,455,452 | 10/1995 | Kiyono | 257/668 |
| 5,461,255 | 10/1995 | Chan et al. | 257/672 |
| 5,510,649 | 4/1996 | Adhihetty et al. | 257/675 |

*Primary Examiner*—Teresa M. Arroyo
*Attorney, Agent, or Firm*—William B. Kempler; Richard L. Donaldson

[57] ABSTRACT

A semiconductor device having a photosensitive thermosetting resin layer 64 provided on top of a protective film 13 for a semiconductor chip 10. A lead frame 11 is affixed to the surface of this photosensitive thermosetting resin layer 64 only at support pin sections 60, 61, and this lead frame 11 is electrically connected to the surface of semiconductor chip 10. Breakage of the wiring and chip cracking are prevented after the pressure-bonding mounting of the lead frame. Because package cracking and package warping are better controlled in thermal processes such as such as IR reflow and resin sealing, a lower cost semiconductor device and manufacturing method are enabled.

10 Claims, 20 Drawing Sheets

PHOTOSENSITIVE POLYIMIDE PRECURSOR

POLYIMIDIZATION ↓

PHOTOSENSITIVE TYPE OF THERMOSETTING POLYIMIDE

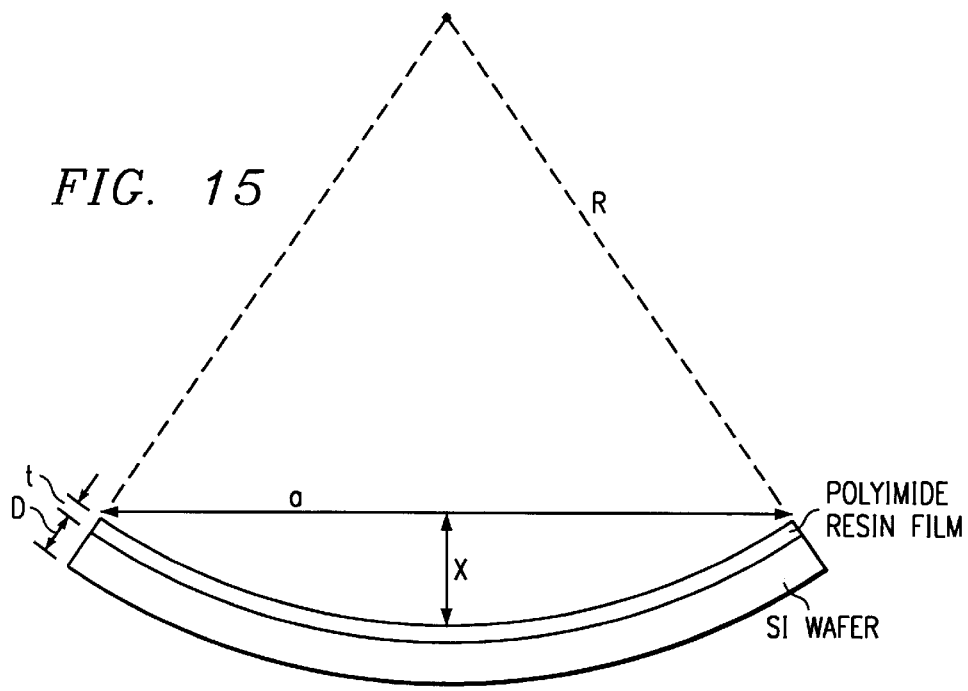
FIG. 15
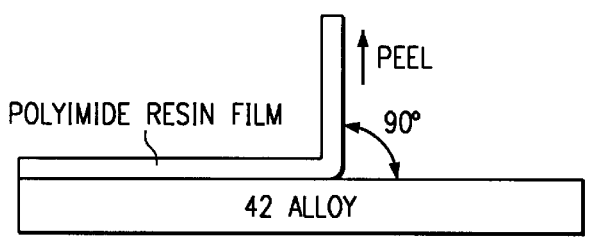
FIG. 16
FIG. 17

INTERRUPTION OF CHEMICAL COUPLER

CHEMICAL COUPLING ENERGY (KCAL/MOL)

| C-N 69.7 | N-H 93.4 | C=N 142.0 |
| C-C 83.1 | C-H 98.8 | C=C 146.0 |
| C-O 84.0 | C-F 105.4 | |

CONSTRUCTION OF THERMOPLASTIC POLYIMIDE RESIN:

SEMICONDUCTOR DEVICE HAVING A TAPELESS MOUNTING

FIELD OF THE INVENTION

This invention relates to semiconductor devices in Lead On Chip (LOC) packages and a methods of making them.

BACKGROUND OF THE INVENTION

One conventional way to seal an IC chip in a package is to provide an LOC construction wherein a lead frame is affixed on the circuit-forming surface of the IC chip, for example as shown in FIGS. 28 and 29.

In FIGS. 28 and 29, a package for a LOC construction of, for example, a DRAM (dynamic RAM) is shown, with a large number of bonding pads 1 being arranged on a straight line in the center of the semiconductor integrated circuit (IC) chip 10. The power supply lines 42, 43, which are called bus bars, and a large number of signal lines 44, 45, are respectively arranged on both sides of this pad line, forming the lead frame 11 used for the LOC. This lead frame is formed from an iron-nickel alloy, a copper alloy, copper, or the like.

The bus bars 42, 43 are connected to the power supply Vss or Vcc, and the signal lines 44, 45 are used for the various signals such as the addresses A0 to A10, CAS, and RAS.

The connections between each bonding pad 1 and each wire is accomplished by means of the respective wire bonding by means of bonding wires 6, 7 on one side of the bonding pad line, and by bonding wires 8, 9 on the other side. In this case, the wires 7, 9 that connect the signal lines 44, 45 (specifically, the inner lead section) straddles on top of the bus bars 42, 43. Also, the entire body is sealed by means of a molding resin 18 (in FIG. 28, shown by the virtual line) consisting of an epoxy resin or the like, with the outer lead section 45a being led to the outside of this molding resin.

In the package for the IC chip 10 made in this manner, the lead frame 11 is affixed on top of the IC chip 10 (specifically, on top of the circuit forming surface) by means of the LOC construction; details are explained with FIG. 29.

First, with regard to the IC chip 10, for example, a passivation film (protective film) 13 comprising a laminated film of $SiO_2$ and $Si_3N_4$, for example, $SiO_2$ and $Si_3N_4$ is provided on one main face of the silicon substrate 12, bonding pads 1 are formed in the window sections of this passivation film and connected to the internal circuits of the IC chip 10, then a thermosetting polyimide protective film 14 is adhered on the entire surface, except for this bonding pad region.

A filler is contained in the molding resin 18 (for example, additional $SiO_2$ for the purpose of reducing the thermal expansion coefficient), but because a filler made in this manner contains radioactive elements such as uranium and thorium, which radiate α-rays, the so-called soft errors are easily generated wherein the α-rays from these radioactive elements are irradiated on the IC chip 10 and the circuit operates erroneously. The polyimide protective film 14 in particular prevents the invasion of the α-rays generated in that manner, and is provided to prevent defects due to soft errors.

The process that forms the polyimide protective film 14 on top of the passivation film 13, which consists of the laminated film of $Si_3N_4$ film 13A and $SiO_2$ film 13B, is shown summarized in FIGS. 30–33.

First, after the passivation film 13 is selectively etched (FIG. 30) to expose the bonding pads 1, a noncured thermosetting polyimide resin 14A is coated on the entire surface (FIG. 31.

Next, an etching mask 20 is formed in the prescribed pattern by ultraviolet radiation and a developing process (FIG. 32). Using this mask 20, the polyimide resin 14A is wet etched, the bonding pads 1 are exposed (FIG. 33) and, after the removal of the mask 20, curing is performed, producing the polyimide protective film 14.

As shown in FIG. 29, frame 11 is adhered on top of the polyimide protective film 14 by means of the double-faced adhesive type of insulating tape 15 (but, in FIG. 28, the insulating tape 15 is omitted from the illustration). This insulating tape 15 is a tape wherein adhesives (for example, thermoplastic adhesives) 17, 19 are respectively painted on both faces of the insulating film substrate 16, lead frame 11 is adhered to the substrate 16 under heat and pressure by means of one of the adhesives 17, and the substrate 16 is adhered on top of the polyimide protective film 14 for the IC chip 10 under heat and pressure by means of the other adhesive 19. In this manner, the lead frame 11 is mounted and pressure bonded on top of the IC chip 10 by means of the insulating tape 15.

However, because the lead frame 11 is affixed on top of the IC chip 10 by means of the insulating tape 15, in addition to the thickness of the insulating film substrate 16 being, for example, 50 μm, the thickness of the adhesives 17, 19 on both of its faces is, for example 12.5 μm, respectively. Therefore, because the combined thickness of the insulating tape 15 becomes as much as 75 μm (depending on the circumstances, 75 to 175 μm), the fact is clear that the various defects (a) to (d) presented below are mainly generated.

(a) Breaks are generated in the metal wiring during the mounting pressure and temperature cycles.

During pressure mounting for the lead frame 11, the stress that is shown by the following formula is generated:

$$\text{stress} = \int_{-65°}^{T_m} E(\alpha_2 - \alpha_1) h W \, dT \qquad \text{(Eq. 1)}$$

where

Tm: temperature (°C.) during mounting

−65°: minimum temperature (°C.) during the thermal cycle

E: modulus of elasticity of the insulating tape including the adhesives $\alpha_2$: thermal expansion coefficient of the insulating tape including the adhesives $\alpha_1$: thermal expansion coefficient of the silicon substrate of the IC chip h: thickness (μm) of the insulating tape including the adhesives W: width (μm) of the insulating tape including the adhesives According to this equation for stress, if the thickness and the thermal expansion coefficient of the insulating tape 15 including the adhesives are large, the stress during the mounting pressure of the lead frame easily becomes large. In the case of the mounting pressure of the lead frame 11, because the insulating tape 15 is used, due to the thickness and thermal expansion coefficient of this insulating tape 15, as is shown in FIG. 34, cracks 23 are generated in the IC chip 10, particularly from the outer edge to the inner portion of the insulating tape 15, and there are instances in which the metal wiring 24 breaks.

(b) The generation of package cracks originating in the expansion of the insulating tape, which are generated during IR reflow.

At the time of affixing the completed IC package on top of the printed circuit wiring board 26, for example, as shown in FIG. 37, as a method of bonding the outer lead section 45a or 44a to the circuit pattern 27 by means of solder, there is the IR reflow method that conducts bonding by means of infrared ray (IR) heating. At the time of IR reflow, the IC package is heated to about 245° C. at its peak.

Currently, the glass transition point (Tg) of the insulating tape is designed to be 210° C. In order to prevent the oxidation of the lead frame 11, it is preferable that the temperature at which the lead frame 11 is glued to the chip 10 be made less than 400° C., but it is necessary that this gluing temperature be above the glass transition temperature of the thermosetting adhesives 17, 19 of the insulating tape 15 +150° C. It is for this reason that the glass transition point of the insulating tape 15 is designed to be 210° C.

However, as for this glass transition point (210° C.), since it is lower than the IR reflow temperature (245° C.), as shown in FIG. 35, the adhesive makes the transition to a near liquid rubber condition during IR reflow, and its adhesive function is remarkably decreased. Due to this, during IR reflow, package cracks are easily generated.

On the other hand, because the combined thickness (75 $\mu$m) of the insulating tape 15 is large, the percentage of moisture absorption of the tape itself (below 85° C., 85% humidity) becomes as high as 2 to 2.5%. If the package is left to set for a long time in the air, the tape absorbs moisture, and as shown in FIG. 36, swelling is easily generated in the adhesives 17 and 19. This causes crack 25 to be generated in sealing resin 18 during IR reflow, and generates package cracks even more easily. It was confirmed that package cracks appeared in 16 out of 120 samples.

(c) Generation of package warpage.

As for the size of each section shown by A', B', C', D', B', F', H', I', and J' in FIG. 29, specifically, these are as shown in the following Table I. Here, these are shown for both a TSOP (Thin Small Outline Package) with a total thickness of about 1 mm (1000 $\mu$m) and an SOJ (Single Outline J-Lead Package) with a total thickness of about 2.7 mm (2700 $\mu$m).

TABLE I

| | 1 mm TSOP | 2.7 mm SOJ |
| --- | --- | --- |
| A' | 0.195 mm (195 $\mu$m) | 0.810 mm (810 $\mu$m) |
| B' | 0.125 mm (125 $\mu$m) | 0.200 mm (200 $\mu$m) |
| C' | 0.075 mm (75 $\mu$m) | 0.075 mm (75 $\mu$m) |
| D' | 0.010 mm (10 $\mu$m) | 0.010 mm (10 $\mu$m) |
| E' | 0.280 mm (280 $\mu$m) | 0.280 mm (280 $\mu$m) |
| F' | 0.325 mm (325 $\mu$m) | 1.335 mm (1335 $\mu$m) |
| H' | 0.395 mm (395 $\mu$m) | 1.085 mm (1085 $\mu$m) |
| I' | 0.325 mm (325 $\mu$m) | 1.335 mm (1335 $\mu$m) |
| J' | 15.240 mm (15,240 $\mu$m) | 15.240 mm (15,240 $\mu$m) |

Because the thickness (C'=75 $\mu$m) of insulating tape 15 is large, it is difficult to adopt a construction balance in the package. In particular, in the case of a TSOP package or the like with a 1 mm thickness, the bowing referred to as package warpage originating in the tape thickness (greater than 75 $\mu$m) is easily generated.

In the 1-mm TSOP package used until now, it is difficult to make the resin thickness (A') on top of the lead frame less than 195 $\mu$m, but this is because of the capabilities of the wire bonder and to prevent the protrusion of the wire loop outside the package. Because of this, when the IC chip thickness (B') is made 280 $\mu$m, the resin thickness on top of the chip becomes H'=395 $\mu$m and the resin thickness beneath the chip becomes I'=325 $\mu$m. This unbalanced thickness relationship is naturally generated due to the insulating tape thickness being C'=75 $\mu$m, and brings about the problem of package warpage.

Due to the generation of this type of package warpage, shown in exaggerated form in FIG. 37, the package is warped 30–60 $\mu$m, the outer lead sections 45a or 44a on both edges in particular rise up in relation to the circuit pattern 27 on top of the printed wiring board 26, and there are instances when these do not connect.

(d) Cost increases.

Insulating tape 15 that adheres the lead frame 11 has a high value of above several tens of yen per single unit, the cost of packages using this rises, and there are limitations to its cost reduction.

Thus, the present applicants, to eliminate the types of defects, in Japanese Patent Application No. Hei 6[1994]-27367, proposed a semiconductor device and its manufacturing method (hereinafter, referred to as the invention of the previous application) for a package construction that can prevent the chip cracking and breakage of the wiring during the pressure bonded mounting and thermal cycles for the lead frame, that can control the package cracking and package warpage in processes such as IR reflow, and that can be manufactured at a low cost.

In other words, the invention of the previous application relates to a semiconductor device wherein a second protective film (in particular, a second protective film that alleviates the influence of the $\alpha$-rays due to the filler of the molding resin) is provided on top of the protective film for the semiconductor chip, the lead frame is affixed on top of this second protective film, and this lead frame is electrically connected to the surface of the semiconductor chip, with the main components of the lead frame being affixed on top of the second protective film with a thermoplastic resin layer interposed and forming at least one portion of the second protective film.

In the semiconductor device of the invention of the previous application, the second protective film can be formed by means of a laminated body of a thermosetting polyimide resin layer, which becomes the bottom layer, and a thermoplastic polyimide resin layer, which becomes the upper layer.

In this case, in the laminated body, in the region wherein the lead frame is adhered, the thermoplastic polyimide resin layer and the thermosetting polyimide resin layer are formed in almost the same pattern. The thickness of the thermoplastic polyimide resin layer is 15–35 $\mu$m, the thickness of the thermosetting polyimide resin layer is 10 to 30 $\mu$m, and in the region where the lead frame is not adhered, the thickness of the thermosetting polyimide resin layer can be 5–15 $\mu$m.

Also, in the laminated body, the thermoplastic polyimide resin layer can also be provided on top of the thermosetting polyimide resin layer in the regions where the lead frame is not adhered. The thickness of the thermoplastic polyimide resin layer can be 15–35 $\mu$m, and the thickness of the thermosetting polyimide resin layer can be 10–30 $\mu$m.

In either case, the total thickness of the laminated body within the lead frame adhesion regions can be 35 to 65 $\mu$m.

In the semiconductor device of the invention of the previous application, the second protective layer can be made of only the thermoplastic polyimide resin layer.

In this case, the thickness of the thermoplastic polyimide resin layer can be 30–50 $\mu$m. Also, it is preferable that the thermoplastic polyimide resin layer also be provided on top of regions where the lead frame is not adhered.

In the semiconductor device of the invention of the previous application, it is also permissible if the edges of the thermoplastic polyimide resin layer within the lead frame adhesion regions protrude 0.1 to 0.15 mm more than the edge of the lead frame (specifically, the width of the thermoplastic polyimide resin layer is made 0.1 to 0.15 mm larger on each side in relation to the width of the lead frame).

Also, the spacing between the cell section of the semiconductor chip and the edge of the thermoplastic resin layer can be 100 to 500 μm on the side of the bonding pad for the semiconductor chip.

Also, the thermoplastic resin layer and/or the thermosetting resin layer can be present in the regions of the bonding pad.

As for the semiconductor device of the invention of the previous application, in actuality, the bonding pad and the lead frame are wire bonded, and the entire body can be sealed with a molding resin. Also, the lead frame can comprise the lead frame section used for the signal lines and the lead frame section used for the power-supply lines.

In the manufacture of the semiconductor device of the invention of the previous application, at least a thermoplastic resin is coated on top of the protective film for the semiconductor chip. This coated resin is patterned, and it is preferable that the lead frame be adhered on top of the thermoplastic resin layer after the curing is accomplished.

In this case, in practice, after the lead frame is adhered, the bonding pads of the semiconductor chip with the lead frame are wire bonded, then the entire body can be sealed with a molding resin.

Next, a concrete example of the invention of the previous application is explained based on FIGS. 38–46. This example is a device wherein the invention of the previous application was applied, for example, to a package for a DRAM, the same keys are applied to the components that are the same as in the prior example shown in FIGS. 28–37, so their explanations are omitted.

First, to explain the construction of the package of an LOC construction based on this example in FIGS. 38 and 39, the distinctive feature of this package is the fact that the thermoplastic polyimide resin layer 54 is laminated on top of the passivation film 13 of the IC chip 10. Using that thermoplasticity, the bus bars 42, 43 and the signal lines 44, 45 (inner lead section) of the lead frame 11 on top of this are bonded by thermal pressure (pressure-bonding mounted).

In other words, the thermoplastic polyimide resin layer 54 provided on top of the IC chip, along with functioning as a second protective film in the same manner as the previously mentioned polyimide protective film 14, is used as an adhesive for the lead frame 11, and the point at which the insulating tape 15 like that previously mentioned is not used is a fact that should be noted.

According to this example, as shown in FIGS. 38 and 39, the second protective layer is formed by means of only the thermoplastic polyimide resin layer 54. This resin layer 54 is provided across almost the entire region of the memory cell section of the IC, as shown by the diagonal lines in FIG. 39.

Also, it is preferable for the thickness (b) of the polyimide resin layer 54 to be 20–45 μm. The glass transition point of the thermoplastic polyimide resin layer 54 should be 210° C. The reason for this is that, in the same manner as presented above, the temperature at the time of thermal pressure bonding of the lead frame on the IC chip surface is less than 400° C., with the wire bonding temperature being 200° C.

Also, when looked at in regard to the entire body of the package, specifically, the size of each component can be designed as shown in the following Table II.

TABLE II

|   | 1 mm TSOP | 2.7 mm SOJ |
|---|---|---|
| A | 0.195 mm (195 μm) | 0.810 mm (810 μm) |
| B | 0.125 mm (125 μm) | 0.200 mm (200 μm) |
| b | 0.030 mm (30 μm) | 0.030 mm (30 μm) |
| E | 0.280 mm (280 μm) | 0.280 mm (280 μm) |
| F | 0.370 mm (370 μm) | 1.380 mm (1380 μm) |
| H | 0.350 mm (350 μm) | 1.040 mm (1040 μm) |
| I | 0.370 mm (370 μm) | 1.380 mm (1380 μm) |
| J | 15.240 mm (15,240 μm) | 15.240 mm (15,240 μm) |

As for the package based on this example, because it is a construction wherein the lead frame 11 is directly pressure-bonding-mounted on top of the thermoplastic polyimide resin layer 54 used as the protective film, the following effects (A)–(E) can be obtained.

(A) The metal wiring breaks that are generated after the pressure-bonded mounting and during the thermal cycles can be prevented.

Because the insulating tape used in the conventional mounting was a thickness of 75 to 175 μm, the thermal stress was large, but because the thickness of the polyimide resin layer 54 is as little as 30–50 μm, the tension stress can be lowered as much as 30% compared to the conventional type.

Specifically, in the package internal section, the maximum stress is concentrated in the chip surface region directly beneath the corner section (P) of the bus bar shown in FIG. 39. Due to this, the tensile stress exerts a harmful influence on the device characteristics. When the tensile stress on top of the chip surface was found during a thermal cycle of 150° C. to −65° C., in the structure of FIG. 38, a tensile stress of 2.90 kg/mm$^2$ was shown. It can be seen that it decreased about 30%, compared to a tensile stress of 4.20 kg/mm$^2$ in the construction of FIG. 29 based on the conventional example.

(B) The package cracks that tend to be generated during IR reflow can be prevented.

Accompanying the capability to reduce the volume of the adhesive layer (polyimide resin layer), since the percentage of water absorption is reduced, the generation of package cracks during IR reflow can be remarkably reduced or prevented. In this case, there were absolutely no package cracks for a sampling of 120 units.

(C) Package warpage can be prevented.

Specifically, in a 1-mm TSOP or the like, a balance of the resin thickness above and below the chip within the package is easily obtained due to the equilibrium between the thicknesses (H) and (I), and the package warpage can be made less than 20 μm or sufficiently prevented.

(D) A cost reduction can be realized.

Compared to the cost of the insulating tape (attached to the lead frame) used until now, in the mounting construction based on this example, the [cost] per unit can be reduced to less than about 1/7 to 1/33.

(E) Soft errors can be effectively prevented.

By providing the thermoplastic polyimide resin layer 54 at a thickness of above 30 μm across the entire region of the cell section, the cell section is physically shielded from the previously mentioned α-rays. Therefore, the α-rays radiated from the lead frame and the filler (SiO$_2$ and the like) within the molding resin 18 are effectively shielded, and soft errors of the memory cell section can be prevented.

The thermoplastic polyimide resin 54 used here has the following physical values, and can be of the construction shown in FIG. 40.

Tensile strength 10 kg/mm$^2$ (room temperature)

Tensile modulus of elasticity 280 kg/mm² (room temperature)

Tensile coefficient of elongation 10% (room temperature)

Volume resistivity 6.3×10¹⁶ Ω-cm

Leakage current value 1.61×10⁻¹¹ (A) (room temperature) 1.07×10⁻¹¹ (A) (PCT after 500 h)

(The PCT (Pressure Coupler Test) test is one stress testing method wherein the body to be tested is placed at a pressure of 1 atm and at 121° C., and the changes in various characteristics before and after that are observed.)

Pyrolysis temperature 520° C.

Thermal expansion coefficient 4.3×10⁻⁵ (1/°C.) (30–100° C.)

Glass transition point 240° C. (In the sample evaluation, those with the points of 160–300° C. were also used.)

Moisture absorption rate 0.91% 22° C., 60% RH)

Next, to explain the main processes of the manufacturing method for the package shown in FIG. 38, first, after the passivation film 13 is selectively etched to expose the bonding pads (FIG. 41), a noncured thermoplastic polyimide resin 54A is painted on the entire face (FIG. 42).

Next, an etching mask 20 of a photoresist is formed in the prescribed pattern by ultraviolet radiation and developing processes (FIG. 43). Using this mask 20, the polyimide resin 54A is wet etched and the bonding pads 1 are exposed (FIG. 44). After removal of the mask 20, the curing is performed, producing the polyimide protective film 54.

The package that is manufactured in this manner has the superior advantages, but it can be seen that there are still problems that must be alleviated. As for these problems, they are mainly generated in the etching process of the polyimide resin 54A shown in FIGS. 43 and 44, which are explained in detail in FIG. 44.

Namely, because the thermoplastic polyimide resin 54A is a non-photosensitive type (even though exposed, it is not made photosensitive), it would be ideal for the etching to be done at the same window size as mask 20 shown by the broken line in FIG. 45(A), but because it depends on wet etching, in actuality, overetching occurs as in FIG. 45(B). Due to this, there are instances wherein the polyimide resin 54 between adjacent bonding pads 1—1 is completely eliminated.

In the event that the thickness of the polyimide resin 54 is 20 μm before curing 10 μm thickness after curing) and the size of the bonding pad 1 is 100 μm×100 μm, the amount of overetching becomes as high as 20–30 μm, the polyimide resin 54 between adjacent bonding pads 1—1 is easily removed by the etching, and the passivation film 13 is exposed.

As a result, when sealing is done by means of molding resin 18 as shown in FIG. 38, this molding resin (for example, a multipurpose type of epoxy resin) 18 comes in direct contact with the passivation film 13, but because the molding resin 18 has poor adhesion characteristics with the Si₃N₄ film 13A of the passivation film 13, fissures are generated in the Si₃N₄ film 13A by the stress due to heat, and become a cause of package cracking. The problems due to the overetching in this manner are also generated in the same manner even in the etching of the thermosetting polyimide resin 14A shown in FIGS. 32 and 33, and the same types of defects as the are created.

This invention should eliminate defects such as the, and its purpose is to offer a semiconductor device and its manufacturing method for a package construction that can prevent chip cracking and wiring breakage after the pressure-bonded mounting of the lead frame and during the thermal cycles, that controls the package cracking and package warpage in processes such as IR reflow and resin sealing, and that can be done at a low cost.

SUMMARY OF THE INVENTION

The present inventors, when conducting various investigations in regard to the invention of the previous application, discovered the fact that in the construction wherein the lead frame is directly pressure-bonding mounted on top of the polyimide resin layer used as the protective film, if a photosensitive thermosetting polyimide resin is used as the resin during its patterning, there is no need to conduct wet etching using an etching mask like that mentioned above, and the patterning can be done to the targeted configuration by means of only exposure and developing processes, thus they arrived at this invention.

In other words, this invention relates to a semiconductor device wherein the lead frame is affixed to the semiconductor chip through the medium of a photosensitive thermosetting resin layer such as a photosensitive thermosetting polyimide resin.

According to the semiconductor device of this invention, since a photosensitive thermosetting resin layer, specifically a photosensitive thermosetting polyimide resin layer, is used in affixing the lead frame on top of the semiconductor chip at the time of forming the windows that expose the bonding pads by, for example, patterning this resin layer, the windows can be formed simply by exposing the photosensitive thermosetting resin layer to the targeted pattern, then developing it.

Therefore, since there is no generation of overetching like that mentioned above, for example, the photosensitive thermosetting resin layer on top of the passivation layer between adjacent bonding points can be removed, the adhesion of the molding resin can be excellently maintained, and package cracking can be prevented. As for this photosensitive thermosetting resin layer, due to the fact that the lead frame is bonded after the thermal curing via thermal pressure, the adhesion strength for the lead frame is generated, and the affixing of the lead frame can be excellently conducted.

In this case, if the surface roughness Ra of the photosensitive thermosetting polyimide resin layer is made greater than 3.0 nm, the adhesion for the lead frame increases. This type of surface roughness can be obtained by means of plasma etching the resin surface after the thermal curing.

Also, if the glass transition point of the photosensitive thermosetting polyimide resin is made 245 to 350° C., since the adhesive function can be maintained even during heating such as the IR reflow (at a reflow temperature, for example, of 245° C.), package cracks can be positively prevented.

Also, in the semiconductor device of this invention, since the lead frame is adhered through the medium of a photosensitive thermosetting resin layer, the thickness of the adhesive layer required for mounting the lead frame can be made smaller. Because of this, along with being able to prevent the metal wiring breaks due to the thermal stress generated after the pressure-bonded mounting and during thermal cycles, the package cracks that have a tendency to be generated during IR reflow can be reduced and a package balance is easily obtained (reduction of package warpage), and cost reductions can be accomplished.

In the semiconductor device of this invention, specifically, a photosensitive thermosetting resin layer is provided as a second protective film (in particular, a second protective film that alleviates the influence of α-rays due to the filler of the molding resin) on top of the protective film for the semiconductor chip, the lead frame is affixed to the surface of this photosensitive thermosetting resin layer, and this lead frame is electrically connected to the circuits of the semiconductor chip.

Also, the lead frame and the bonding pads for the semiconductor chip that are present in a region wherein the photosensitive thermosetting resin layer has been selectively removed are wire bonded, and the entire body is sealed with a molding resin.

The lead frame can be comprised of a lead frame section used for signal lines and a lead frame section used for power-supply lines.

Also, the lead frame has an inner lead section, an outer lead section, and a support pin section. In the event that only this support pin section is affixed to the photosensitive thermosetting resin layer, because the contact surface area of the lead frame in relation to the semiconductor chip can be reduced by a wide margin, the stress that can be generated on the semiconductor chip is greatly reduced and, for example, the breakage of the metal wiring during the thermal cycles can be prevented.

In this case, it is preferable that the inner lead section be separated by being positioned at a spacing of 0.010–0.20 mm from the surface of the photosensitive thermosetting resin layer.

Also, the photosensitive thermosetting resin layer consists of a polyimide resin and the thickness is 20–40 μm. If it is greater than 30 μm, the radiation α-rays from the filler of the molding resin is sufficiently shielded, which is preferable for preventing soft errors.

This invention also offers a manufacturing method for a semiconductor device consisting of a process that coats a photosensitive thermosetting resin layer on top of a semiconductor chip, a process that hardens this photosensitive thermosetting resin layer that has been coated in a prescribed pattern by light exposure, a process that removes the non-exposed sections of the photosensitive thermosetting resin layer, a process that thermally cures the photosensitive thermosetting resin layer that remains on top of the semiconductor chip after this removal process, and a process that bonds via thermal pressure, a lead frame on top of this thermally cured photosensitive thermosetting resin layer.

In this manufacturing method, it is preferable that after the thermosetting process the surface of the photosensitive thermosetting resin layer be processed by plasma etching, and that the lead frame be bonded via thermal pressure on the surface of the photosensitive thermosetting resin layer that has been processed by this plasma etching.

Also, it is preferable that a photosensitive thermosetting resin layer be coated on top of the protective film for the semiconductor chip, and that this photosensitive thermosetting resin layer that has been coated be cured by ultraviolet rays to form a prescribed pattern.

Also, it is preferable for the lead frame and the bonding pads of the semiconductor chip that are present in the region wherein the photosensitive thermosetting resin layer has been selectively removed to be wire bonded, and for the entire body to be sealed with a molding resin.

DESCRIPTION OF EMBODIMENTS

Below, embodiments of this invention are explained.

FIGS. 1–24 show Embodiment 1, wherein this invention is applied, for example, to a package for a DRAM. However, the components that are involved in the example shown in FIGS. 28–45 have the same keys, so their explanations are omitted [here].

First, an explanation will be given for the construction of a package for an LOC construction based on this embodiment with FIGS. 1–5 (however, FIGS. 1–4 show the package and FIG. 5 shows the lead frame). As for the distinctive characteristics of the construction of this package, photosensitive-type of thermosetting polyimide resin layer 64 is laminated on top of the passivation film 13 for the IC chip 10. Also, in the same manner as the previously mentioned polyimide protective film 14, along with preventing soft errors due to α-rays from the filler of the sealing resin 18, the lead frame 11 having bus bars 42, 43, signal lines 44, 45 (inner lead section), and support pin sections 60, 61, is bonded by thermal pressure (thermo-bonding mounted) on top of the resin layer 64 only at the support pin sections 60, 61.

In other words, along with the photosensitive thermosetting polyimide resin layer 64 provided on top of the IC chip functioning as a second protective film in the same manner as the previously mentioned polyimide protective film 14, the point should be noted that it functions as an adhesive for the lead frame 11 and that an insulating tape 15 like that previously mentioned is not used.

Also, the lead frame 11, except for the support pin sections 60, 61, is in the condition of being separated by being placed a fixed spacing C from the semiconductor chip 10, with only the support pin sections 60, 61 that are folded to the semiconductor chip 10 side being affixed on top of the semiconductor chip 10 by means of the resin layer 64. Also, the fact that the lead frame 11 is fastened by means of this should be noted. Here, the amount of folding of the support pin sections 60, 61 is equivalent to the spacing C, and can be 0.010 to 0.200 mm, for example, 0.050 mm. The folding of the support pin sections in this way is called "downset" in the following description.

In FIG. 5, the lead frame 11 up to the position of the broken line 18 is resin-sealed along with the semiconductor chip; after the resin sealing, tie bar 70 is cut, then each lead section is separated.

Also, the photosensitive thermosetting polyimide resin layer 64 used as the second protective film, as shown by the slanted lines in FIG. 3, is provided across almost the entire region of the memory cell section of the IC. Also, in order to improve its adhesion, the surface of the resin layer 64 is controlled to a surface roughness Ra of greater than 3.0 nm by plasma etching.

It is preferable that the thickness D of the polyimide resin layer 64 be 20–40 μm, with above 30 μm being particularly preferable. Also, the glass transition point of the polyimide resin layer 64 can be above 245° C., specifically 245–350° C. The reasons for this are that, in the same manner as mentioned above, the temperature during the thermal pressure bonding of the lead frame to the IC chip surface is less than 400° C. and the wire bonding temperature is 200° C.

Also, as for the size of each component, when looked at in regard to the entire package, specifically, these can be designed as shown in the following Table III.

TABLE III

|   | 1 mm TSOP | 2.7 mm SOJ |
|---|---|---|
| A | 0.195 mm (195 μm) | 0.810 mm (810 μm) |
| B | 0.125 mm (125 μm) | 0.200 mm (200 μm) |
| C | 0.050 mm (50 μm) | 0.050 mm (50 μm) |
| D | 0.020 mm (20 μm) | 0.020 mm (20 μm) |
| E | 0.260 mm (260 μm) | 0.260 mm (260 μm) |

TABLE III-continued

|   | 1 mm TSOP | 2.7 mm SOJ |
|---|---|---|
| F | 0.350 mm (350 µm) | 1.360 mm (1360 µm) |
| H | 0.390 mm (390 µm) | 1.080 mm (1080 µm) |
| I | 0.350 mm (350 µm) | 1.360 mm (1360 µm) |
| J | 15.240 mm (15,240 µm) | 15.240 mm (15,240 µm) |

As for the package based on this example, because it is a construction wherein the lead frame 11 is directly pressure bonding mounted on top of the photosensitive thermosetting polyimide resin layer 64 used as the protective film, in addition to the following effects (A) to (E), the following superior affects (F) to (J) can also be obtained.

(A) The metal wire breakage generated after pressure-bonding mounting and during the thermal cycles can be prevented.

Because the insulating tape used in mounting until now was as thick as 75 to 175 µm, the thermal stress was large, but because the thickness of the polyimide resin layer 64 is as small as 20–40 µm, the tensile stress can be reduced by as much as 30% compared to the type used until now.

In particular, because the maximum stress concentrates in the chip surface region directly beneath the corner section P of the bus bar shown in FIG. 3 in the package inner sections, the tensile stress due to this exerts a harmful influence on the device characteristics. When the tensile stress on top of the chip surface during a thermal cycle of 150–65° C. was examined, in the construction of FIG. 3, a tensile stress of 2.90 kg/mm$^2$ was shown. It can be seen that this is also decreased about 30% compared to the tensile stress in the construction of FIG. 29 based on the prior example, which is 4.20 kg/mm$^2$.

(B) The package cracks that have a tendency to be generated during the IR reflow can be prevented.

Along with being able to reduce the volume of the adhesive layer (polyimide resin layer), since the moisture content is reduced, the generation of package cracks during the IR reflow can be remarkably reduced or prevented. In this case, there were no package cracks for a sample of 120 units.

(C) Package warpage can be prevented.

In particular, in a 1-mm TSOP or the like, it becomes easy to obtain a balance of the resin thickness above and below the chip within the package due to the equilibrium between the thicknesses (H) and (I), the package warpage can be reduced to 20–40 µm or less, and can be sufficiently prevented.

(D) Cost reductions can be realized.

Compared to the cost of the insulating tape (lead frame attachment) used until now, in the mounting construction based on this example, the per unit [cost] can be reduced to less than about 1/7 to 1/33.

(E) Soft errors can be effectively prevented.

Due to the fact that the thermosetting polyimide resin layer 64 is provided at a thickness of above 20 µm across almost the entire region of the cell section, the cell section is sufficiently shielded from α-rays. Therefore, the α-rays radiated from the lead frame and the filler (SiO$_2$ or the like) within the molding resin 18 are effectively blocked, and soft errors of the memory cell section can be prevented.

(F) The overetching of the polyimide resin layer can be reduced by a wide margin.

Because the thermosetting polyimide resin layer 64 is a photosensitive type, as is clear from the later presented manufacturing process, the windows can be formed on top of the bonding pads simply by exposing this photosensitive thermosetting polyimide resin layer in the targeted pattern, then developing it.

Therefore, there is no generation of overetching like that shown in FIG. 45(B). Also, since the amount of overetching during the patterning or developing process and the like is an extremely small 2–5 µm, a sufficient amount of photosensitive thermosetting polyimide resin layer 64 can be left on top of the passivation film 13 between adjacent bonding pads 1—1, as shown in FIG. 45(A). Also, the adhesion for the molding resin can be excellently maintained and package cracks can be prevented.

(G) The breakage of the metal wiring can be prevented to a greater extent.

The lead frame 11, having the inner lead sections 44, 45, outer lead sections 44a, 45a, and support pin sections 60, 61 is affixed to the photosensitive thermosetting polyimide resin layer 64 only at the support pin sections 60, 61 downset, the contact surface area of the lead frame 11 with the semiconductor chip 10 is reduced by a wide margin, the stress that can be generated on the semiconductor chip 10 is greatly reduced, and breakage of the metal wiring during the thermal cycles can be prevented to a greater extent. Since the lead frame 11 can be sufficiently affixed by means of only affixing the support pin sections 60, 61, there is no necessity to affix the inner lead section to the semiconductor chip by an adhesive tape.

(H) Package cracking can be prevented to a greater extent.

Because the glass transition point of the photosensitive thermosetting polyimide resin layer 64 is above 245° C., specifically 245 to 350° C., and because the moisture content is less than 1.5%, the adhesive function can be maintained even during heating, such as during the IR reflow (at a reflow temperature for example, of 245° C.), and the package cracking can be positively prevented to a greater extent.

(I) The adhesion of the lead frame is improved.

As for the photosensitive thermosetting polyimide resin layer 64, an adhesive force is generated for the lead frame 11 due to the fact that the lead frame 11 is thermal-pressure bonded after the thermal curing, and the affixing of the lead frame can be excellently conducted. In this case, since the surface roughness (Ra) of the photosensitive thermosetting polyimide resin layer 64 is made greater than 3.0 nm, the adhesion for the lead frame 11 is improved. This type of surface roughness can be obtained by plasma etching the resin layer surface after thermal curing.

(J) The resin sealing can be excellently conducted.

In the wire bonding of the lead frame 11, its inner lead sections 44, 45 are bent and clamped to the semiconductor chip 10 side. However, after the wire bonding, they return to the original shape due to their elastic recovery force and, as shown in FIG. 1, return to a position that is separated by being placed at a spacing C in relation to the semiconductor chip 10.

Because of this, during the later resin sealing, the peripheral section of the lead frame 11 is clamped by a metal mold. At the time of injecting the melted resin, even though the lead frame (specifically, the inner lead frame sections) is made to expand by the heat and pressure, because lead frame 11 is separated from the semiconductor chip 10, there is no generation of stress between the semiconductor chip 10 even by the expansion of the lead frame 11. As a result, there is no destruction of the chip, warping of the package, or the like, and the resin sealing can be conducted with a good reliability. Also, the parasitic capacitance between the bit line of the chip 10 and the lead frame 11 is reduced, and is effective against soft error defects.

In contrast, in the event that the lead frame 11 is affixed to the semiconductor chip 10 (refer to FIG. 29), there are instances of destruction of the semiconductor chip 10, warping of the package, and the like by the stress due to the expansion of the lead frame. Also, an increase in the parasitic capacitance and soft errors is easily generated.

The photosensitive thermoplastic polyimide resin 64 used in this embodiment has the following physical values. It can comprise the structural model shown in FIG. 6, which can be obtained by the polyimidization of a precursor. This is an ester coupled type, but an ion coupled type or the like can also be used.

Tensile strength 10 kg/mm² (room temperature)

Tensile modulus of elasticity 280 kg/mm² (room temperature)

Tensile coefficient of elongation 10% (room temperature)

Volume resistivity $6.3 \times 10^{18}$ Ω-cm

Leakage current value $1.61 \times 10^{-11}$ (A) (room temperature) $1.07 \times 10^{-11}$ (A) (PCT after 500 h)

(The PCT (Pressure Cooker Test) test is one stress testing method wherein the body to be tested is placed at a pressure of 1 atm and 121° C., and the changes in various characteristics before and afterwards are observed.)

Pyrolysis temperature 520° C.

Thermal expansion coefficient $4.3 \times 10^{-5}$ (1/°C.) (30–100° C.)

Glass transition point 245° C.

Moisture absorption rate 0.91% 22° C., 60% RH)

Next, to explain the main processes of the manufacturing method for the package shown in FIGS. 1–3, first, after selectively etching the passivation film 13 (a laminated film of $Si_3N_4$ film 13A and $SiO_2$ film 13B) to expose the bonding pads 1, a noncured photosensitive thermosetting polyimide resin layer 64A) is coated on the entire surface to a dry thickness of 20 to 45 μm (FIG. 8).

Next, using exposure mask 70, the polyimide resin layer 64A is selectively exposed by means of ultraviolet rays 71 (FIG. 9) and noncured section (the nonexposed section) is removed by a developing process (FIG. 10, leaving this section that has been hardened by the exposure.

In this manner, the bonding pads 1 are exposed, then the polyimide protective film 64 is formed by a curing process by heating (FIG. 11). The processing conditions for this thermal curing can be 300–350° C., for 2–4 h, and in air or in an $N_2$ gas flow. This polyimide protective film 64 has a thickness of 20–40 μm and a glass transition point of above 245° C. (below 350° C.)

Next, the surface of the polyimide protective film 64 is bombarded by plasma 72 via $CF_4$ or a mixed gas of $CHF_3$ and $CF_4$. This is plasma etched, then the surface is suitably roughened so that the surface roughness Ra becomes greater than 3.0 nm.

Next, on top of the roughened surface of the polyimide protective film 64, as shown in FIGS. 1–3, the support pin sections 60, 61 (downset amount is 0.010–0.20 mm) of the lead frame 11 (made of 42 alloy) are affixed on top of the semiconductor chip 10 by thermal-pressure bonding at 350° C.×4 kg.

Next, after the inner lead sections 44, 45 and bus bars 42, 43 of the lead frame 11 are wire bonded by wires (99.99% gold) to the bonding pads 1, ejection molding is done with a thermosetting molding resin such as a multipurpose type of epoxy resin, then thermal hardening (curing) is executed at 175° C.×5 h.

The obtained package is an SOJ 34 pin type of 600 (width)×875 (length)×106 (height) mil (see FIGS. 1–3).

On packages of the present application examples explained above, several evaluations were conducted below.

IR Reflow Test

The results of IR reflow (max 245° C.) after being left at 85° C./85% RH for 336 h are as follows. There were no problems of package cracking. This is because the glass transition point of the thermosetting polyimide resin 64 was set high and the moisture content was set below 1.0%.

This embodiment Prior example (FIG. 29)

Failure rate 0/120 16/120

Thermal Cycle Test (−65–150° C.)

The results of the thermal cycle test are as follows. There were no problems of package cracking.

|  | This embodiment | Prior example (FIG. 29 |
|---|---|---|
| Failure rate for 2000 cycles | 0/20 | 0/20 |

Soft Error

Due to the fact that the thickness of the thermosetting polyimide resin layer 64 is made 20–40 μm, as shown in FIG. 13, the soft errors due to the α-rays, such as the ASER (Accelerated Soft Error Rate) of the 4 M DRAM, is remarkably reduced. In contrast, because the soft error becomes large with the film thickness of the same resin layer at less than 20 μm, it is desirable that the film thickness be made greater than 20 μm.

In this case, as shown in FIG. 13, if the lead frame 11 is thermal-pressure bonded to the surface of the resin layer 64 on top of the IC chip surface, the lead frame 11 sinks into the resin layer 64 only to the depth of about 10 μm. Because of this, in the event that the thickness of the thermosetting polyimide resin layer 64 is set to less than 30 μm, ASER problems are easily generated.

As was explained in the, in order to prevent ASER (Accelerated Soft Error Rate) failures, a coating material of greater than 20 μm (before mounting, greater than 30 μm) on top of the cell section of the IC chip is necessary.

In the prior construction (FIG. 29), since only a coating material (polyimide layer) 14 with a 10 μm thickness was coated on top of the cell section of the chip, as an ASER countermeasure, processing was executed to suppress the amount of uranium and thorium to less than 1 ppb of the silica contained in the mold sealing material.

With this as the cause, the price of the mold sealing material was twice as high as normal. However, in this embodiment, because the thermosetting polyimide 64 is coated to a thickness of greater than 20 μm on the cell section, preferably greater than 30 μm, there is no worry with regard to ASER failures, and due to the fact that ordinary sealing materials (with amounts of uranium and thorium of 100 ppb) can be used, it has become possible to halve that cost.

Parasitic Capacitance

In the event of using the lead frame in the bit line of a DRAM, even in order to suppress the problem of parasitic capacitance (bit-line to lead frame capacitance) to less than 1 pF, as shown in FIG. 14, it is necessary for the thickness of the thermosetting polyimide resin layer 64 to be greater than 30 μm. It can be seen that it is necessary for it to be greater than 20 μm after the lead-frame pressure bonding.

The curve shown in FIG. 14 was derived using the following equation.

$$C = 4\pi\epsilon_0 \epsilon / \ln 4t2$$

with
t: polyimide thickness
$\epsilon$: polyimide dielectric rate (3.3)
$\epsilon_0$: dielectric rate of vacuum
C: capacitance Package Warpage In the event the photosensitive type of processing polyimide resin 64 on top of the passivation film is made at a thickness exceeding 40 µm after thermal curing, because a warpage of 800 µm is generated in a 6-in wafer, it is necessary for the polyimide resin 64 to be made at less than 40 µm thick.

The increase in the warping of the wafer brings about an increase in its internal stress. The internal stress can be determined with the following equation. In FIG. 15, the warped of the wafer is shown.

$$\delta(stress) = D^2 E / 6Rt(1-v)$$

with $R$(radius of curvature) $= (a^2 + 4X^2)/8X$

X: warpage of wafer
a: length of the arc of the warped wafer
D: wafer thickness (280 µm)
E: Si (wafer) modulus of elasticity (16200 kg/mm$^2$)
t: polyimide resin film thickness
v: Poisson ratio (0.3)

The internal stress of the wafer changes as follows, depending on the thickness of the polyimide resin film. In order to make the internal stress of the wafer less than 2 kg/mm$^2$, it is necessary to make the polyimide resin film thickness less than 40 µm (in the event the internal stress of the wafer is made greater than 2 kg/mm$^2$, faults in the Si crystals and the like are generated, bringing about harmful effects on the reliability).

| Polyimide thickness (µm) | Wafer internal stress |
| --- | --- |
| 20 | 1.04 kg/mm$^2$ |
| 30 | 1.73 kg/mm$^2$ |
| 40 | 2.08 kg/mm$^2$ |
| 50 | 2.29 kg/mm$^2$ |

From the viewpoint of the ASER failures, parasitic capacitance, and wafer warpage, it is necessary and desirable for the film thickness of the polyimide resin film on top of the passivation film to be within 20–40 µm.

In the TSOP package shown in FIG. 1, when the mold sealing resin thickness on the chip upper face is 0.390 mm, and the mold sealing resin thickness on the chip lower face is made 0.350 mm, because the values of the resin thickness above and below are close, the package warpage becomes 20–40 µm.

Also, as can be understood from the package internal construction shown in FIGS. 1 and 2, it is preferable that the inner lead section of the lead frame 11, through which the current flows, be separated from the surface of the polyimide resin layer film 64 by 0.010–0.20 mm. In other words, it is preferable for the support pin sections 60, 61 of the lead frame 11, through which the current does not flow, to be bent within a range of 0.10 to 0.20 mm (downset amount) and adhered to the surface of the polyimide resin film 64.

The reason for this is because, at the same time as more positively maintaining stability in regard to the parasitic capacitance between the bit line and lead frame, as well as the ASER failures, the stress of the chip surface is relieved.

Tensile Stress

In a 600×875×106 mil (width×length×height) package, in its internal section, the maximum stress is concentrated in the chip surface region directly below the corner sections (P) of the bus bar shown in FIG. 3, with the tensile stress due to this exerting a harmful influence on the device characteristics. When the maximum tensile stress on the chip surface directly below the lead frame during a thermal cycle of 150° C. to −65° C. is found, in the construction of FIG. 3, a tensile strength of 2.19 kg/mm$^2$ is shown. It can be seen that it is fairly reduced compared to the construction of FIG. 29 based on the prior example wherein the tensile stress is 4.20 kg/mm$^2$, and compared to the construction of FIG. 38 wherein the tensile stress is 3.31 kg/mm$^2$.

As for the photosensitive thermosetting polyimide resin, in a crack test under thermal cycles (−65 to 180° C.), there were no cracks up to 3000 thermal cycles, and a mechanical potential energy of 800 kg/mm$^2$ was shown.

Here, the mechanical characteristics were found by the following formulas (the sample was made 3 mm wide, 10 µm thick, and 50 mm long, and tension was applied at 40 mm/min and measured with a tension testing machine Sub Pulser FB made by Shimadsu Seisakusho).

Destruction stress = F (force applied to both ends of the polyimide)/W · T
  W (width of test sample)
  T (thickness of test sample)
Elongation = L2 (deformation at destruction point)/L × 100
  L (length of test sample)
Modulus of elasticity = (L × S2/(W × T × L1)
  S2 (destruction point stress)
  L1 (destruction point deformation)

The surface area was found for the bottom section of the stress and deformation curve derived by these means, which is called the mechanical potential energy of the polyimide, and was found by the formula expressed as:

$$\int_0^{L_Z} S \cdot dL \quad (S: \text{stress}, L: \text{deformation}) \qquad \text{(Eq. 2)}$$

Overetching

Because the photosensitive thermosetting polyimide resin is cured by bringing about a chemical reaction by photosensitive agents within the polyimide resin layer with ultraviolet rays (UV), at the time of patterning, the resist mask used in the wet etching of a nonphotosensitive type of polyimide resin becomes unnecessary. At the time of the wet etching of a nonphotosensitive type of thermoplastic polyimide resin, an alkaline etching liquid passed the boundary between the resist and the polyimide layer, generating overetching, which became a problem. However, because there is no wet etching with the photosensitive thermosetting polyimide resin, and because the patterning is done by developing after exposure, overetching is almost not seen. For example, in the etching of a polyimide film of 10 µm thickness after curing on top of a 100 µm×100 µm bonding pad, the window becomes only about 2 to 5 µm larger.

Adhesive Strength

The following tests were conducted in regard to the adhesion between a polyimide resin surface and alloy 43 (lead frame material). The sample of the polyimide resin was made in the following manner. Following the process flow shown in FIGS. 7–12, the execution of the coating, UV exposure, and developing, the curing conditions for the polyimide resin, and the plasma etching conditions (gas used for etching) were set as follows.

Curing conditions: temperature 350° C. (2 h), 390° C. (1 h)
Atmosphere: $N_2$ gas, air flow
Plasma etching conditions: $CHF_3/CF_4$, $CF_4$, none The following seven types of samples were then made. In all of these, the thickness after curing was set to 10 μm.

| Sample No. | Curing conditions Temperature | Atmosphere | Plasma conditions |
|---|---|---|---|
| 1 | 350° C. | $N_2$ | None |
| 2 | 350° C. | $N_2$ | $CF_4$ |
| 3 | 390° C. | $N_2$ | None |
| 4 | 390° C. | $N_2$ | $CF_4$ |
| 5 | 390° C. | Air | None |
| 6 | 390° C. | Air | $CF_4$ |
| 7 | 390° C. | $N_2$ | $CHF_3/CF_4$ |

After dicing and cutting off the respective samples to a width of 2.5±0.05 cm, the cutoff sections were bonded in a 23% HF solution, then the polyimide resin film was pulled from the wafer. The respective polyimide resin films, after washing with pure water, were dried for 1 h at 55° C.

Each of these polyimide resin films, as shown in FIG. 16, were then placed between a pair of heaters and thermal-pressure bonded with an alloy 42 flat surface plate of 200 μm thickness. These thermal-pressure bonding conditions were as follows.

Thermal-pressure bonding temperatures: 280, 310, 330, 370, 400° C.
Thermal-pressure bonding pressures: 3.0 kg/cm$^2$, 6.0 kg/cm$^2$
Thermal-pressure bonding times: 3 sec, 6 sec As shown in FIG. 17, each of the following measurements were done in regard to the adhesive strength, based on the 90° peeling test method of ISO Regulations 4578-1979, then the adhesive strength at the polyimide resin/alloy 42 boundary was found. The results are shown in the following Tables IV–IX.

TABLE IV

| Sample No. | Pressure bonding temperature | Pressure bonding pressure | Pressure bonding times | Adhesive strength |
|---|---|---|---|---|
| 1 | 280° C. | 3.0 Kg/cm$^2$ | 3 sec | 0 g/cm |
| | | | 6 sec | 0 g/cm |
| | | 6.0 Kg/cm$^2$ | 3 sec | 0 g/cm |
| | | | 6 sec | 0 g/cm |
| | 310° C. | 3.0 Kg/cm$^2$ | 3 sec | 130 g/cm |
| | | | 6 sec | 204 g/cm |
| | | 6.0 Kg/cm$^2$ | 3 sec | 148 g/cm |
| | | | 6 sec | 130 g/cm |
| | 330° C. | 3.0 Kg/cm$^2$ | 3 sec | 371 g/cm |
| | | | 6 sec | 390 g/cm |
| | | 6.0 Kg/cm$^2$ | 3 sec | 501 g/cm |
| | | | 6 sec | 501 g/cm |
| | 370° C. | 3.0 Kg/cm$^2$ | 3 sec | >1200 g/cm |
| | | | 6 sec | >1200 g/cm |
| | | 6.0 Kg/cm$^2$ | 3 sec | >1200 g/cm |
| | | | 6 sec | >1200 g/cm |
| | 400° C. | 3.0 Kg/cm$^2$ | 3 sec | >1200 g/cm |
| | | | 6 sec | >1200 g/cm |
| | | 6.0 Kg/cm$^2$ | 3 sec | >1200 g/cm |
| | | | 6 sec | >1200 g/cm |

TABLE V

| Sample No. | Pressure bonding temperature | Pressure bonding pressure | Pressure bonding times | Adhesive strength |
|---|---|---|---|---|
| 2 | 280° C. | 3.0 Kg/cm$^2$ | 3 sec | 167 g/cm |
| | | | 6 sec | 130 g/cm |
| | | 6.0 Kg/cm$^2$ | 3 sec | 130 g/cm |
| | | | 6 sec | 204 g/cm |
| | 310° C. | 3.0 Kg/cm$^2$ | 3 sec | >1200 g/cm |
| | | | 6 sec | >1200 g/m |
| | | 6.0 Kg/cm$^2$ | 3 sec | >1200 g/cm |
| | | | 6 sec | >1200 g/cm |
| | 330° C. | 3.0 Kg/cm$^2$ | 3 sec | >1200 g/cm |
| | | | 6 sec | >1200 g/cm |
| | | 6.0 Kg/cm$^2$ | 3 sec | >1200 g/cm |
| | | | 6 sec | >1200 g/cm |
| | 370° C. | 3.0 Kg/cm$^2$ | 3 sec | >1200 g/cm |
| | | | 6 sec | >1200 g/cm |
| | | 6.0 Kg/cm$^2$ | 3 sec | >1200 g/cm |
| | | | 6 sec | >1200 g/cm |
| | 400° C. | 3.0 Kg/cm$^2$ | 3 sec | >1200 g/cm |
| | | | 6 sec | >1200 g/cm |
| | | 6.0 Kg/cm$^2$ | 3 sec | >1200 g/cm |
| | | | 6 sec | >1200 g/cm |

TABLE VI

| Sample No. | Pressure bonding temperature | Pressure bonding pressure | Pressure bonding times | Adhesive strength |
|---|---|---|---|---|
| 3 | 280° C. | 3.0 Kg/cm$^2$ | 3 sec | 0 g/cm |
| | | | 6 sec | 0 g/cm |
| | | 6.0 Kg/cm$^2$ | 3 sec | 0 g/cm |
| | | | 6 sec | 0 g/cm |
| | 310° C. | 3.0 Kg/cm$^2$ | 3 sec | 140 g/cm |
| | | | 6 sec | 167 g/cm |
| | | 6.0 Kg/cm$^2$ | 3 sec | 111 g/cm |
| | | | 6 sec | 149 g/cm |
| | 330° C. | 3.0 Kg/cm$^2$ | 3 sec | 278 g/cm |
| | | | 6 sec | 297 g/cm |
| | | 6.0 Kg/cm$^2$ | 3 sec | 297 g/cm |
| | | | 6 sec | 538 g/cm |
| | 370° C. | 3.0 Kg/cm$^2$ | 3 sec | 374 g/cm |
| | | | 6 sec | 409 g/cm |
| | | 6.0 Kg/cm$^2$ | 3 sec | 520 g/cm |
| | | | 6 sec | 483 g/cm |
| | 400° C. | 3.0 Kg/cm$^2$ | 3 sec | >1200 g/cm |
| | | | 6 sec | >1200 g/cm |
| | | 6.0 Kg/cm$^2$ | 3 sec | >1200 g/cm |
| | | | 6 sec | >1200 g/cm |

TABLE VII

| Sample No. | Pressure bonding temperature | Pressure bonding pressure | Pressure bonding times | Adhesive strength |
|---|---|---|---|---|
| 4 | 280° C. | 3.0 Kg/cm$^2$ | 3 sec | 0 g/cm |
| | | | 6 sec | 0 g/cm |
| | | 6.0 Kg/cm$^2$ | 3 sec | 0 g/cm |
| | | | 6 sec | 0 g/cm |
| | 310° C. | 3.0 Kg/cm$^2$ | 3 sec | 167 g/cm |
| | | | 6 sec | 260 g/cm |
| | | 6.0 Kg/cm$^2$ | 3 sec | 278 g/cm |
| | | | 6 sec | 297 g/cm |
| | 330° C. | 3.0 Kg/cm$^2$ | 3 sec | 427 g/cm |
| | | | 6 sec | 445 g/cm |
| | | 6.0 Kg/cm$^2$ | 3 sec | 650 g/cm |
| | | | 6 sec | 575 g/cm |
| | 370° C. | 3.0 Kg/cm$^2$ | 3 sec | >1200 g/cm |
| | | | 6 sec | >1200 g/cm |
| | | 6.0 Kg/cm$^2$ | 3 sec | >1200 g/cm |
| | | | 6 sec | >1200 g/cm |

TABLE VII-continued

| Sample No. | Pressure bonding temperature | Pressure bonding pressure | Pressure bonding times | Adhesive strength |
|---|---|---|---|---|
| | 400° C. | 3.0 Kg/cm² | 3 sec | >1200 g/cm |
| | | | 6 sec | >1200 g/cm |
| | | 6.0 Kg/cm² | 3 sec | >1200 g/cm |
| | | | 6 sec | >1200 g/cm |

TABLE VIII

| Sample No. | Pressure bonding temperature | Pressure bonding pressure | Pressure bonding times | Adhesive strength |
|---|---|---|---|---|
| 5 | 280° C. | 3.0 Kg/cm² | 3 sec | 0 g/cm |
| | | | 6 sec | 0 g/cm |
| | | 6.0 Kg/cm² | 3 sec | 0 g/cm |
| | | | 6 sec | 0 g/cm |
| | 310° C. | 3.0 Kg/cm² | 3 sec | 0 g/cm |
| | | | 6 sec | 0 g/m |
| | | 6.0 Kg/cm² | 3 sec | 121 g/cm |
| | | | 6 sec | 170 g/cm |
| | 330° C. | 3.0 Kg/cm² | 3 sec | 156 g/cm |
| | | | 6 sec | 150 g/cm |
| | | 6.0 Kg/cm² | 3 sec | 262 g/cm |
| | | | 6 sec | 280 g/cm |
| | 370° C. | 3.0 Kg/cm² | 3 sec | 440 g/cm |
| | | | 6 sec | 421 g/cm |
| | | 6.0 Kg/cm² | 3 sec | 550 g/cm |
| | | | 6 sec | 573 g/cm |
| | 400° C. | 3.0 Kg/cm² | 3 sec | 660 g/cm |
| | | | 6 sec | 620 g/cm |
| | | 6.0 Kg/cm² | 3 sec | >1200 g/cm |
| | | | 6 sec | >1200 g/cm |

TABLE IX

| Sample No. | Pressure bonding temperature | Pressure bonding pressure | Pressure bonding times | Adhesive strength |
|---|---|---|---|---|
| 6 | 280° C. | 3.0 Kg/cm² | 3 sec | 0 g/cm |
| | | | 6 sec | 0 g/cm |
| | | 6.0 Kg/cm² | 3 sec | 0 g/cm |
| | | | 6 sec | 0 g/cm |
| | 310° C. | 3.0 Kg/cm² | 3 sec | 204 g/cm |
| | | | 6 sec | 220 g/m |
| | | 6.0 Kg/cm² | 3 sec | 167 g/cm |
| | | | 6 sec | 242 g/cm |
| | 330° C. | 3.0 Kg/cm² | 3 sec | 260 g/cm |
| | | | 6 sec | 272 g/cm |
| | | 6.0 Kg/cm² | 3 sec | 402 g/cm |
| | | | 6 sec | 417 g/cm |
| | 370° C. | 3.0 Kg/cm² | 3 sec | 612 g/cm |
| | | | 6 sec | 600 g/cm |
| | | 6.0 Kg/cm² | 3 sec | 720 g/cm |
| | | | 6 sec | 760 g/cm |
| | 400° C. | 3.0 Kg/cm² | 3 sec | >1200 g/cm |
| | | | 6 sec | >1200 g/cm |
| | | 6.0 Kg/cm² | 3 sec | >1200 g/cm |
| | | | 6 sec | >1200 g/cm |

A presentation is made later in regard to an evaluation of the results of the Tables IV–IX.

Glass Transition Point, Surface Roughness, & Surface Chemical Composition of Photosensitive Thermosetting Polyimide Resin The glass transition point was checked using a TMA measuring machine made by the Shimadzu Seisakusho. The glass transition point is called the temperature at which the polyimide is transformed from the glass condition to the gum condition.

The surface roughness was checked using a Nano Scope II Atomic Force Microscope (AFM) made by the Digital Instruments Co. In this case, the probe tip angle was 20°, its length was 10 $\mu$m, and its material was monocrystalline silicon. Ra and RMax were found according to the definition of JIS B0601.

The surface chemical composition was checked using an ESCA-300 made by, the Seiko Denshi Co. The composition ratio was found for the CO— (carbonyl group) and the COO— (carboxyl group) of the polyimide surface. Beginning with the total ratio of the carbonyl group and the carboxyl group of a polyimide surface of 2×2 mm², the physical property values of the polyimide are shown in the following Table X.

TABLE X

Physical property values of the polyimide

| Sample No. | Glass Transition Point (° C.) | Surface Roughness $R_a$ (nm) | $R_{max}$ (nm) | Surface Chemical Composition Total CO and COO (contents wt %) |
|---|---|---|---|---|
| 1 | 260 | 2.52 | 33.06 | 08% |
| 2 | 260 | 3.86 | 44.62 | 23% |
| 3 | 330 | 2.48 | 30.52 | 08% |
| 4 | 330 | 3.70 | 41.44 | 22% |
| 5 | 350 | 1.90 | 24.27 | 06% |
| 6 | 350 | 3.40 | 40.38 | 21% |
| 7 | 330 | 3.11 | 39.04 | 19% |

From the results of the above Tables IV–X, [it can be seen that] in order to prevent the oxidation of a lead frame of alloy 42, it is preferable that the temperature at which the lead frame is glued to the surface of the chip (thermosetting polyimide resin) be less than 400° C. It is also preferable that the glass transition point Tg of the thermosetting polyimide resin be more than 50–100° C. lower than the temperature at which the lead frame is glued (in other words, less than 300–350° C.).

In other words, in improving the adhesive force, as for the temperature at which the lead frame is glued (pressure bonding temperature), it can be seen that in Table IV it can be above Tg (260° C.)+110° C., in Table V above Tg (260° C.)+50° C., in Table VI above Tg (330° C.)+70° C., in Table VII above Tg (330° C.)+40° C., and in Table VIII above Tg (350° C.)+50° C. These facts show that it is preferable for the glass transition point (Tg) of the thermosetting polyimide resin to be more than 50–100° C. lower than the temperature at which the lead frame is glued.

Also, it is better if the glass transition point of the thermosetting polyimide resin is above the IR reflow temperature (245° C.). This is because in the event the glass transition point is below 245° C., the polyimide resin shifts to the gum condition, and the adhesive force with the mold sealing resin becomes poor.

From the above facts, [it can be seen that] it is preferable for the glass transition point of the photosensitive thermosetting polyimide resin to be 350–245° C.

Also, the fact that the surface roughness of the thermosetting polyimide resin affects the adhesive strength between a lead frame of alloy 42 and the polyimide resin has been made clear from the experimental results.

In other words, the adhesive force is increased by making the surface roughness Ra of the polyimide resin above 3.00 nm by plasma processing.

An AFM photo is shown in FIG. 18 for a polyimide resin without plasma processing (the Sample No. 3), and in FIG.

19 for a polyimide resin wherein the surface has been roughened by plasma processing (the Sample No. 4).

The roughening of the surface results in a chemical coupling of the polyimide resin being interrupted. Because the coupling force of the C—N, C—C, and C—O of the polyimide resin (Refer to FIG. 6 is weak, these are interrupted due to the plasma etching process as shown by (A), (B), and (C) in FIG. 20.

As a result, the data of the XPS (X-ray photoemission spectroscopy) shown in FIG. 22, compared to that of FIG. 21, show that the peaks of P1 (C—C coupling) and P2 (C—O or C—N coupling) are reduced, and that the peaks of P3 (C=O: carbonyl group and P4 (COO—: carboxyl group: this is the interrupted portion at position (A) of FIG. 20 at which oxidation is generated) are increased. The assignment of the chemical coupling and the coupling energy of the polyimide resin is shown in FIG. 23.

The wettability of the carbonyl group and carboxyl group with alloy 42 is good, and hydrogen coupling is promoted. Because of this, the close adhesion force is increased.

Electrical Characteristics

A 34 pin SOJ package was constructed having the internal construction shown in FIGS. 1 and 2. In other words, a test chip having silicon, a metal, a passivation film ($Si_3N_4$, $SiO_2$, and a thermosetting polyimide resin (with a 350° C. curing temperature, $N_2$ gas, $CF_4$ plasma processing), respectively, was constructed like that of FIG. 24.

The physical properties of the thermosetting epoxy resin (used for sealing) and the photosensitive thermosetting polyimide resin used here are shown below.

Thermosetting epoxy resin

Multipurpose type of epoxy resin

Bending strength 14.2 kg/mm² (room temperature)

Bending modulus of elasticity 1580 kg/mm² (room temperature)

Glass transition point 157° C.

Thermal expansion coefficient 10 ppm (1/°C.)

Photosensitive thermosetting polyimide resin

Tensile strength 15.6 kg/mm² (room temperature)

Tensile modulus of elasticity 300 Kg/mm² (room temperature)

Tensile modulus of elongation 48% (room temperature)

Percentage of water absorption 1.4% (22° C., 60% RH)

Permittivity 3.3

Glass transition point 260° C.

The test chip 80 of FIG. 24 was divided into a large number of blocks, both ends of the wiring 81 of a zigzag shape were connected to the bonding pads 82 within region A of each block, and a lead frame, omitted from the illustration, was affixed to the polyimide resin on top of the chip in an LOC construction. The continuity (measurement for whether the circuit is open or shorted) and leakage (leakage current) were then checked by measuring the current value between the outer lead sections. As for the region B, wiring was installed for the chip corner sections, and as for region C, wiring used for connecting between the blocks was installed, then measurements were conducted in the same manner as in the above.

Specifically, an IR reflow test of 85/85 336 h [85° C./85% RH for 336 h], thermal cycles (−65 to 150° C.), PCT (pressure cooker test) (2 atm, 121° C.), and a test involving leaving it at a high temperature (175° C.) were done. The results are shown below.

| Continuity/Leak electrical characteristics check (failure rate) |
| --- |
| 85/85 336 h IR reflow (MAX 245° C.) 0/30 |
| Temperature cycles (−65 to 150° C.) 1000 cycles 0/30 |
| Left at high temperature (175° C.) 1000 h 0/30 |
| PCT (2 atm, 121° C.) 500 h 0/30 |

From these results, the fact was made clear that there were no problems in the continuity and leak checks.

FIG. 25 shows another embodiment wherein this invention was applied to an LOC construction.

In this embodiment, compared to the construction of FIG. 1, the fact that the lead frame 11, including the inner lead sections 44, 45, are affixed by contacting the photosensitive thermosetting polyimide resin layer 64, and the fact that the support pin [sections] 60, 61 are not downset, are points of difference. The other factors are the same.

Therefore, in this embodiment the effects due to the usage of the polyimide resin layer 64 can be obtained in the same manner as presented in the embodiments. Also, as for the lead frame 11 itself, it becomes possible to use the same device as in products used until now, and there is no need to use a process for the downset.

FIG. 26 shows another embodiment wherein this invention was applied to another type of construction.

In other words, according to this embodiment, in a multipin QFP (Quad Flat Package), the IC chip mounting section 152 of a lead frame used as an LOC construction is thermal-pressure bonded on top of the IC chip 10 with the photosensitive thermosetting polyimide resin layer 64 interposed, the bonding pads on the periphery of the IC chip 10 are wire bonded to the inner lead sections 153, 154 by means of wires 150, 151, and the entire body is sealed with molding resin 158. Besides that, the film construction and the like beneath the resin layer 64 can be the same as that presented in the embodiments.

Since the package according to this embodiment also does not use an insulating tape with an adhesive on both sides, and-the lead frame is pressure mounted on top of the IC chip by means of the thermosetting polyimide resin layer 64, the same types of effects as presented in the embodiments can be obtained.

In addition, since the wire bonding is conducted between the periphery of the IC chip and the inner lead sections, as shown in FIG. 26, the wire contacts (shorts) to the chip, which have a tendency to be generated in the event the inner lead section and the IC chip 10 affixed on top of the mounting section 152 of the lead frame are wire bonded, can be prevented.

FIG. 27 shows an embodiment wherein this invention is applied to a COL (Chip On Lead) construction.

According to this embodiment, the IC chip 10 is mounted on top of the inner lead sections 44, 45 of the lead frame 11 by means of the photosensitive thermosetting polyimide resin layer 64, and is connected between the chip 10 and lead frame 11 by the wire bonding from the chip upper section.

In this type of COL construction, package cracks and the like during IR reflow can be reduced by the usage of the resin layer 64. This is because the molding resin 18 has an excellent adhesive force with the polyimide resin 64.

This invention was exemplified above, but as for the embodiments, further modifications are possible based on the technical concepts of this invention.

For example, the photosensitive thermosetting polyimide resin that was used in the embodiments is not limited to those of the construction; its construction components, physical characteristics, and the like can be variously modified. Also, the usage of resins other than the polyimide type is possible as long as they have equivalent physical characteristics.

Also, as for the region that forms this resin layer, besides providing it almost entirely on top of the chip, it can also be provided locally in the required locations. For example, it can be provided only on the support pin sections, but in this case it is necessary that the regions other than that be covered with another second protective film.

This invention can be applied to other devices such as the TSOP type or SOJ type as a package. Furthermore, this invention can be applied not only to a DRAM (16 megabyte, 64 megabyte, and the like), but also to other various devices.

This invention, as was presented above, uses a photosensitive type of thermoplastic resin layer in affixing the lead frame on top of the semiconductor chip, specifically a photosensitive thermosetting polyimide resin layer. At the time of forming windows that expose the bonding pads, for example, by patterning this resin layer, it becomes possible to form the windows simply by exposing and developing the photosensitive thermosetting resin layer in the targeted pattern.

Therefore, because the overetching like that mentioned above is not generated, for example, the photosensitive thermosetting resin layer can remain on top of the passivation film between adjacent bonding pads, the close adhesion with the molding resin can be excellently maintained, and package cracks can be prevented. As for this photosensitive thermosetting resin layer, by means of thermal-pressure bonding the lead frame after thermal curing, an adhesive force for the lead frame is generated and the affixing of the lead frame can be excellently accomplished.

Lastly, in the semiconductor device of this invention, since the lead frame is affixed with the photosensitive thermosetting resin layer interposed, the thickness of the adhesive necessary in mounting the lead frame can be reduced. Due to this, along with being able to prevent metal wiring breaks due to the thermal stress generated after the pressure-bonding mounting and during the thermal cycles, the package cracks that have a tendency to be generated during IR reflow are reduced, a package balance is easily achieved (reduction of package warpage), and a cost reduction can be accomplished.

BRIEF DESCRIPTION OF THE DRAWINGS

FIG. 15 is an abbreviated view for the purpose of explaining the wafer warpage.

FIG. 16 is a cross-sectional view of the process that bonds, by thermal pressure, the polyimide resin layer and the lead frame material.

FIG. 17 is a cross-sectional view of a sample for the purpose of explaining the conditions for the peel test.

Figure 1:
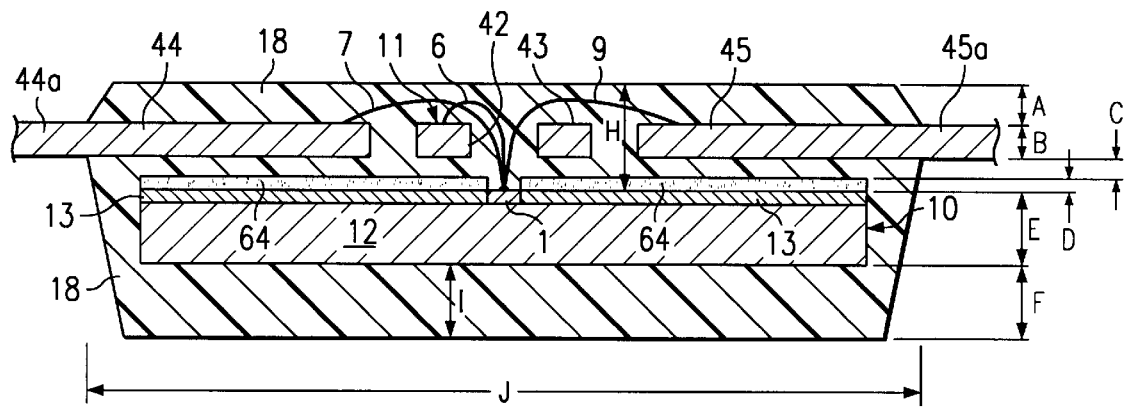
FIG. 1 is a cross-sectional view (of FIG. 4 through line I—I) of an IC package of a LOC construction based on an embodiment of this invention.
Figure 2:
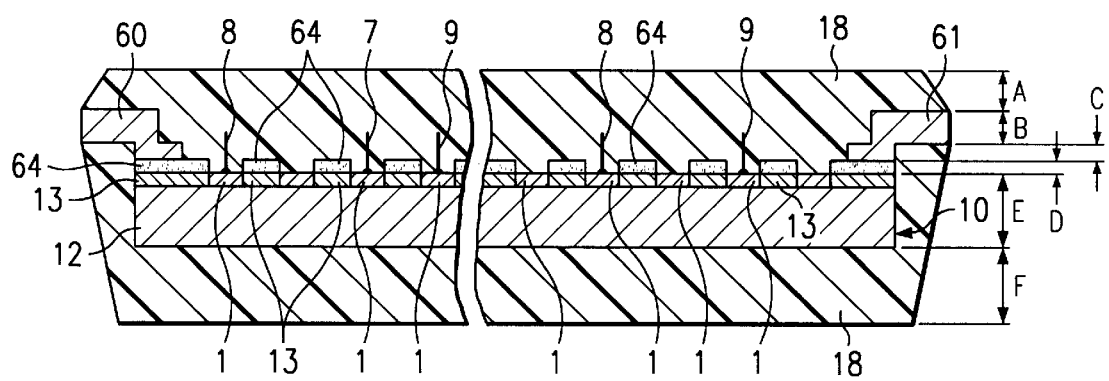
FIG. 2 is a cross-sectional view of this same package (of FIG. 4 through line II—II).
Figure 3:
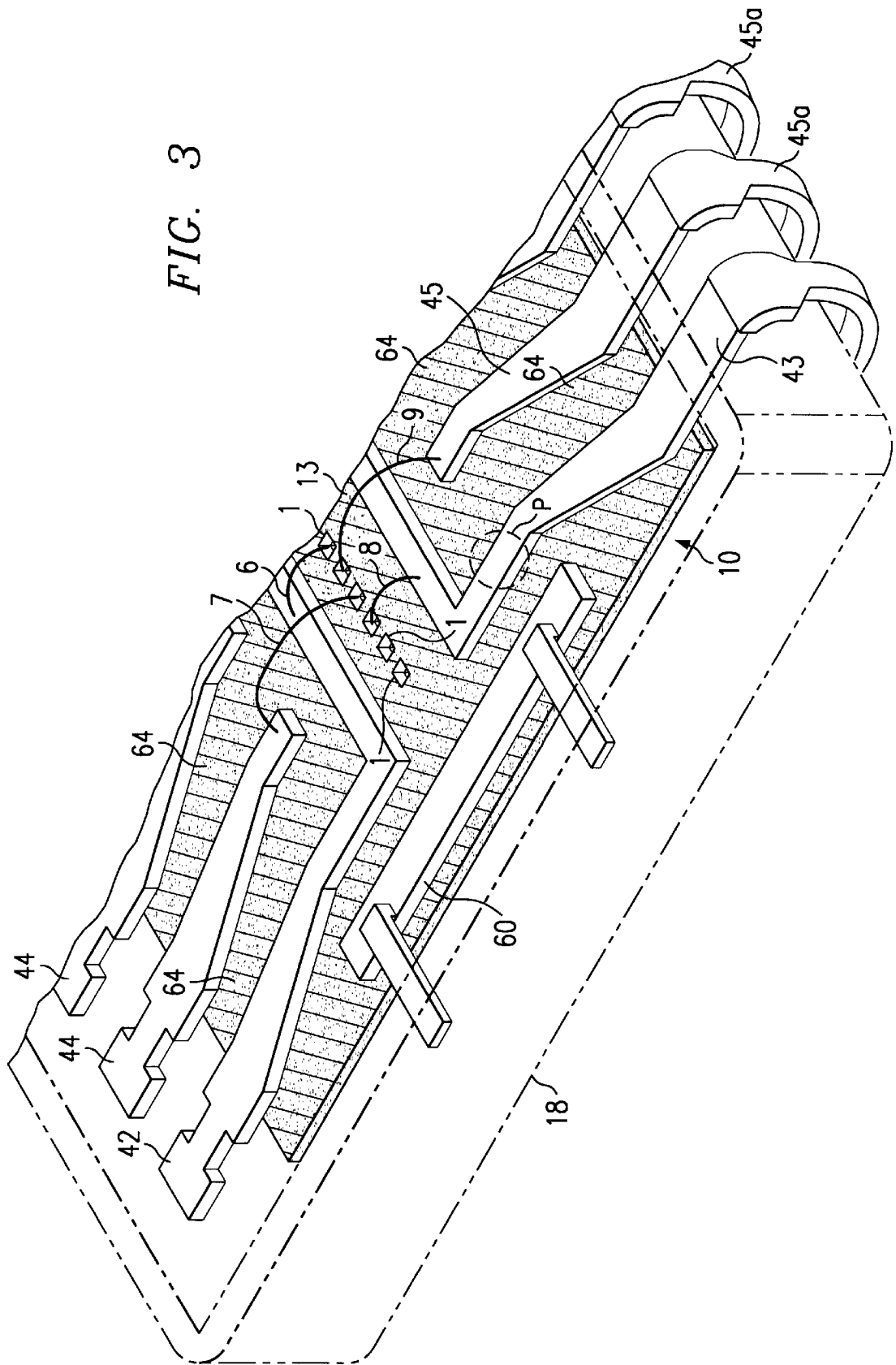
FIG. 3 is an enlarged perspective view of the main components of this same package.
Figure 4:
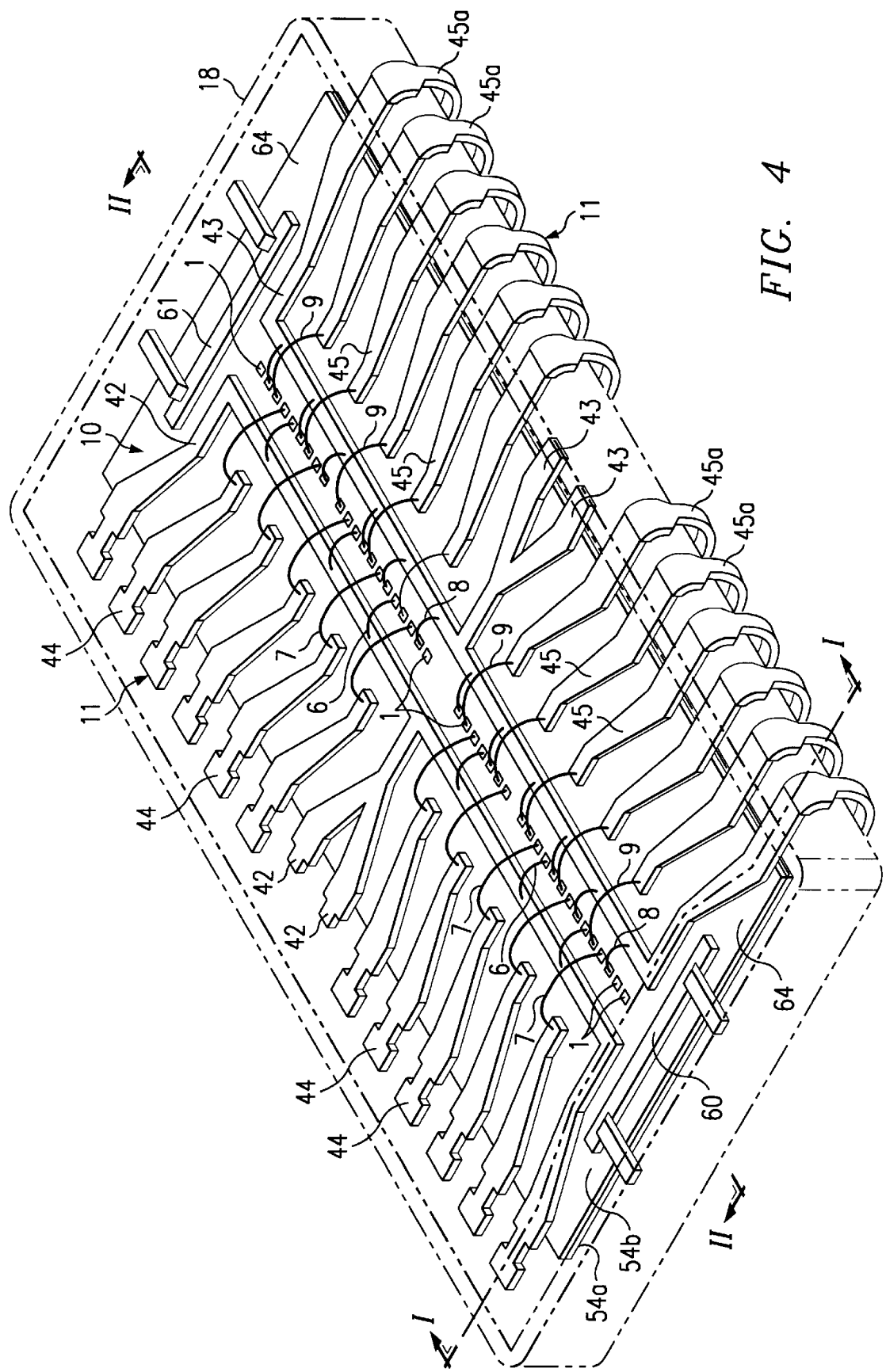
FIG. 4 is a perspective view of the main components of this same package.
Figure 5:
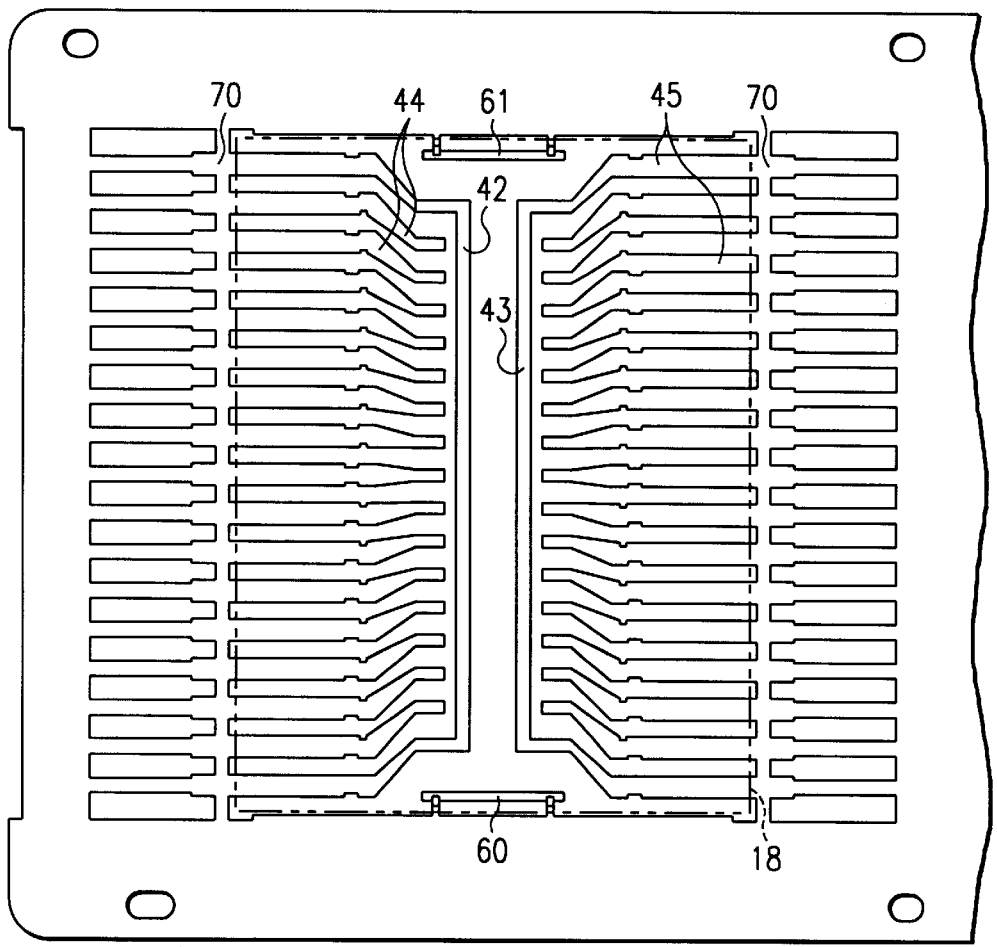
FIG. 5 is a plane view of the lead frame of this same package.
Figure 6:
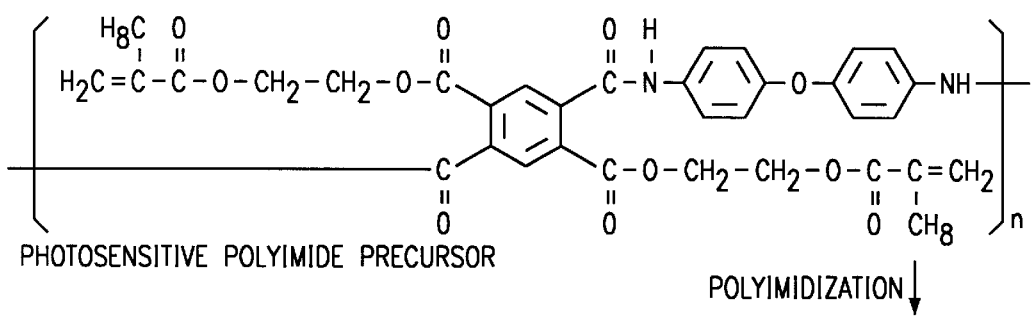
FIG. 6 is a drawing showing a construction formula of a photosensitive thermosetting polyimide resin.
Figure 6:
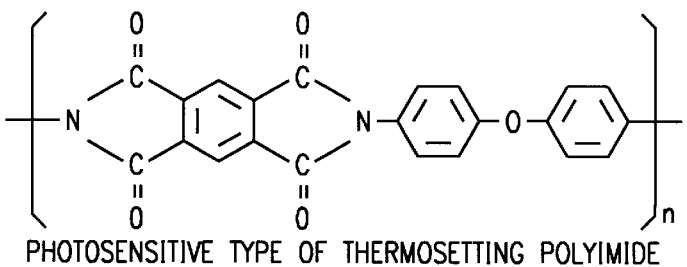
Figure 7:
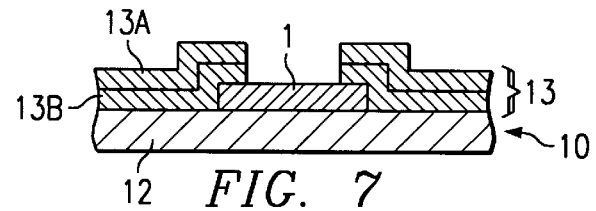
FIG. 7 is a cross-sectional view showing one process of the manufacturing method for this same package.
Figure 8:
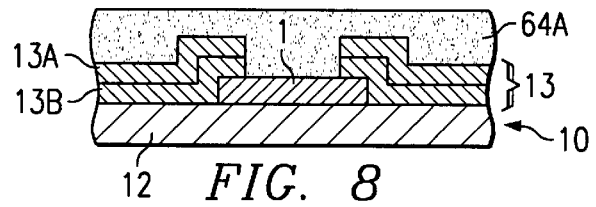
FIG. 8 is a cross-sectional view showing another process of the manufacturing method for this same package.
Figure 9:
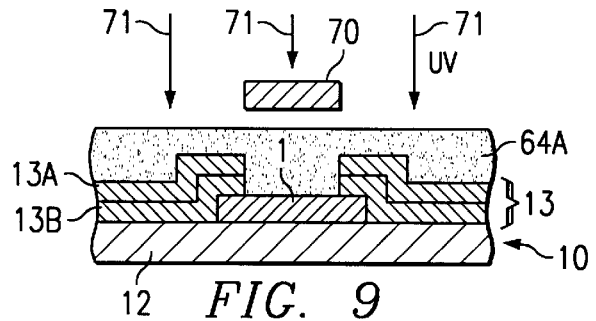
FIG. 9 is a cross-sectional view showing another process of the manufacturing method for this same package.
Figure 10:
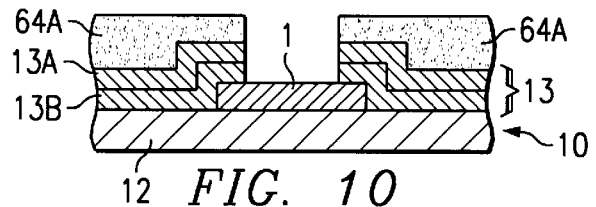
FIG. 10 is a cross-sectional view showing another process of the manufacturing method for this same package.
Figure 11:
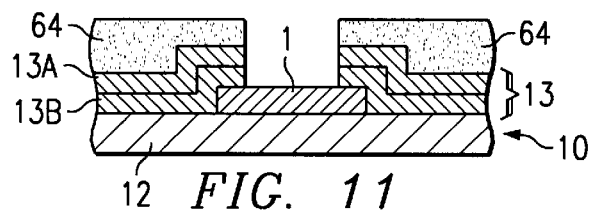
FIG. 11 is a cross-sectional view showing another process of the manufacturing method for this same package.
Figure 12:
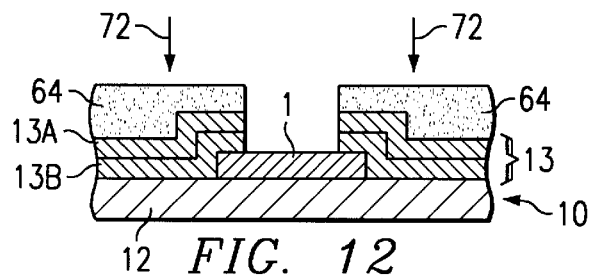
FIG. 12 is a cross-sectional view showing yet another process of the manufacturing method for this same package.
Figure 13A:
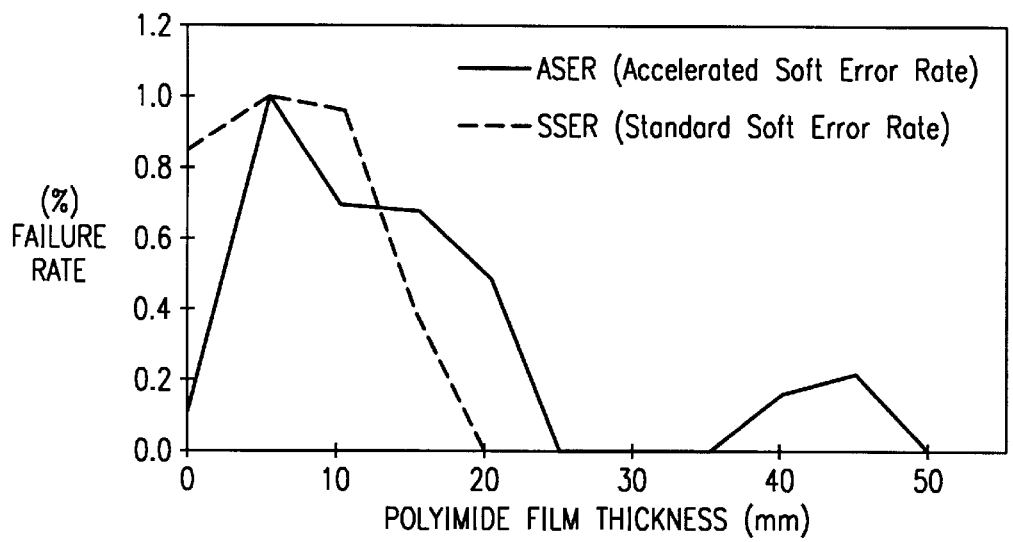
FIG. 13 is a graph showing the soft error (failure rate) due to α-rays and an enlarged cross-sectional view of the package main components.
Figure 13B:
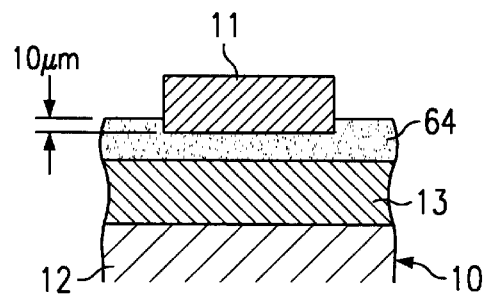
Figure 14:
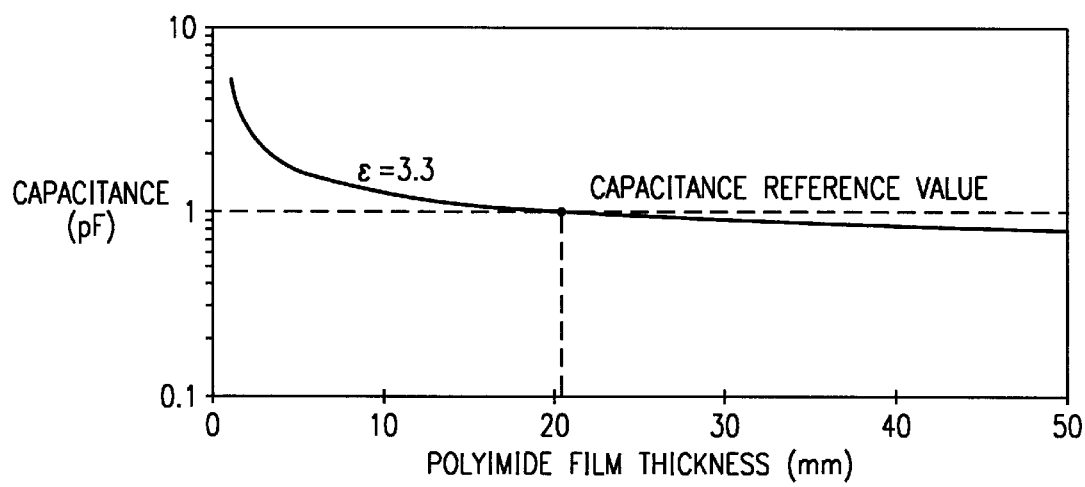
FIG. 14 is a graph showing the changes in the parasitic capacitance.
Figure 18:
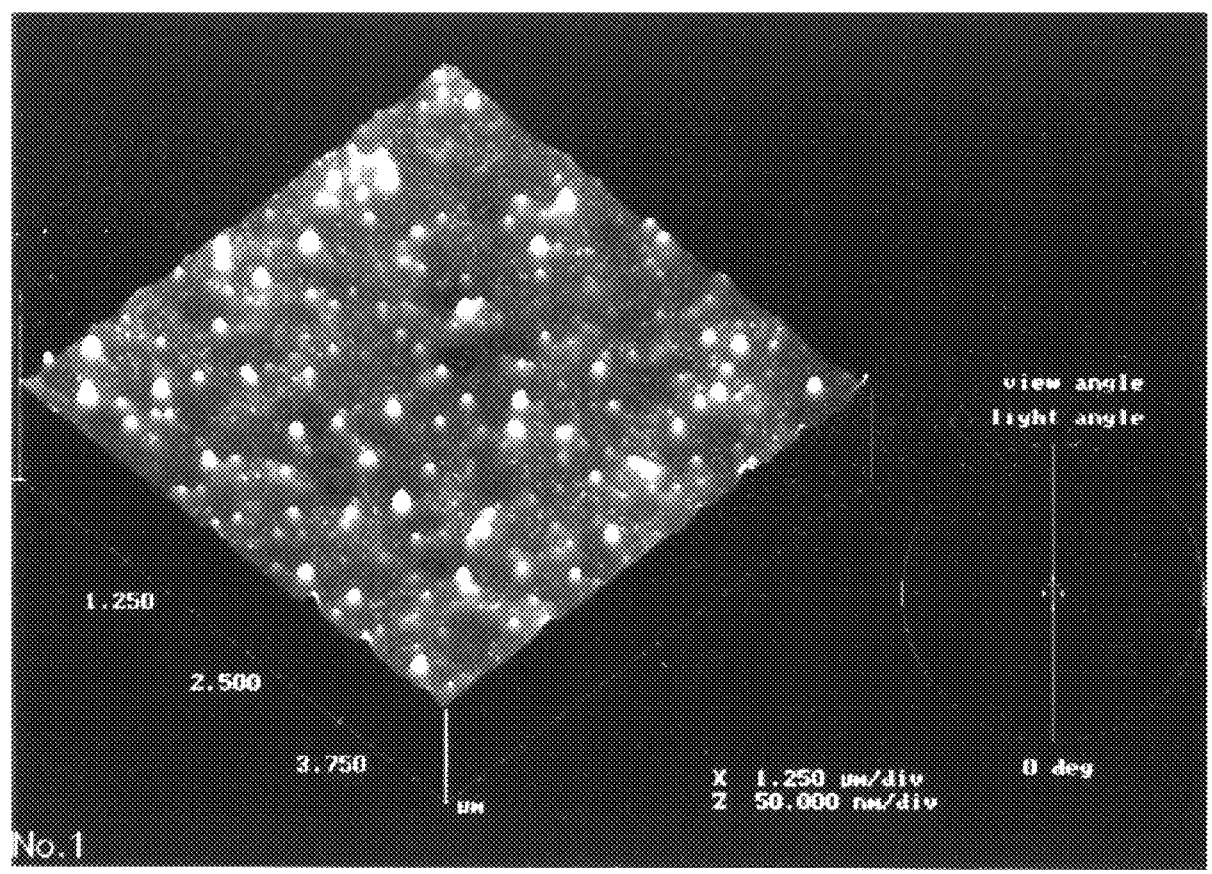
FIG. 18 is a sketch of an AFM image of the polyimide resin (without plasma processing).
Figure 19:
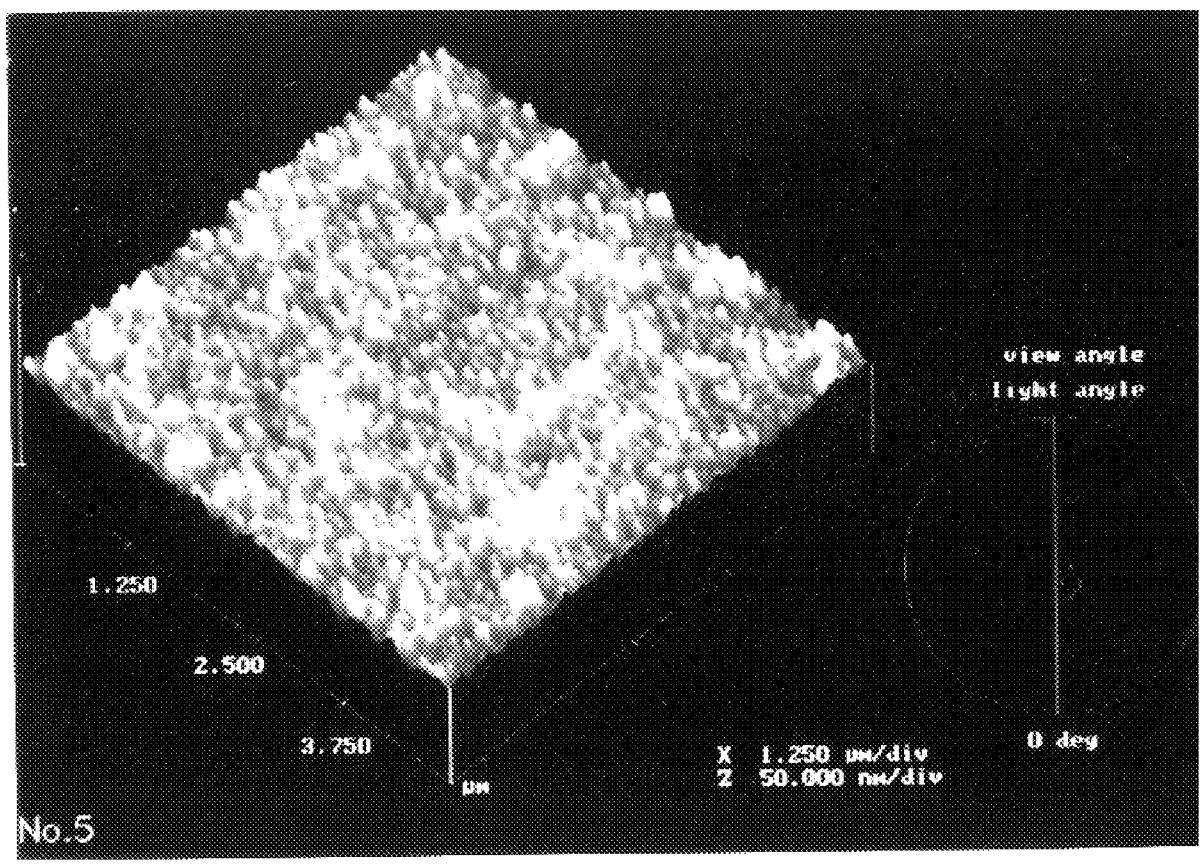
FIG. 19 is a sketch of an AFM image of the polyimide resin (with plasma processing).
Figure 20:
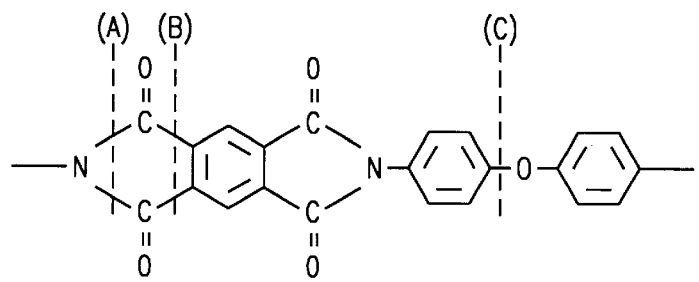
FIG. 20 is a drawing for the purpose of explaining the interruption of the chemical coupling of the polyimide resin.
Figure 21:
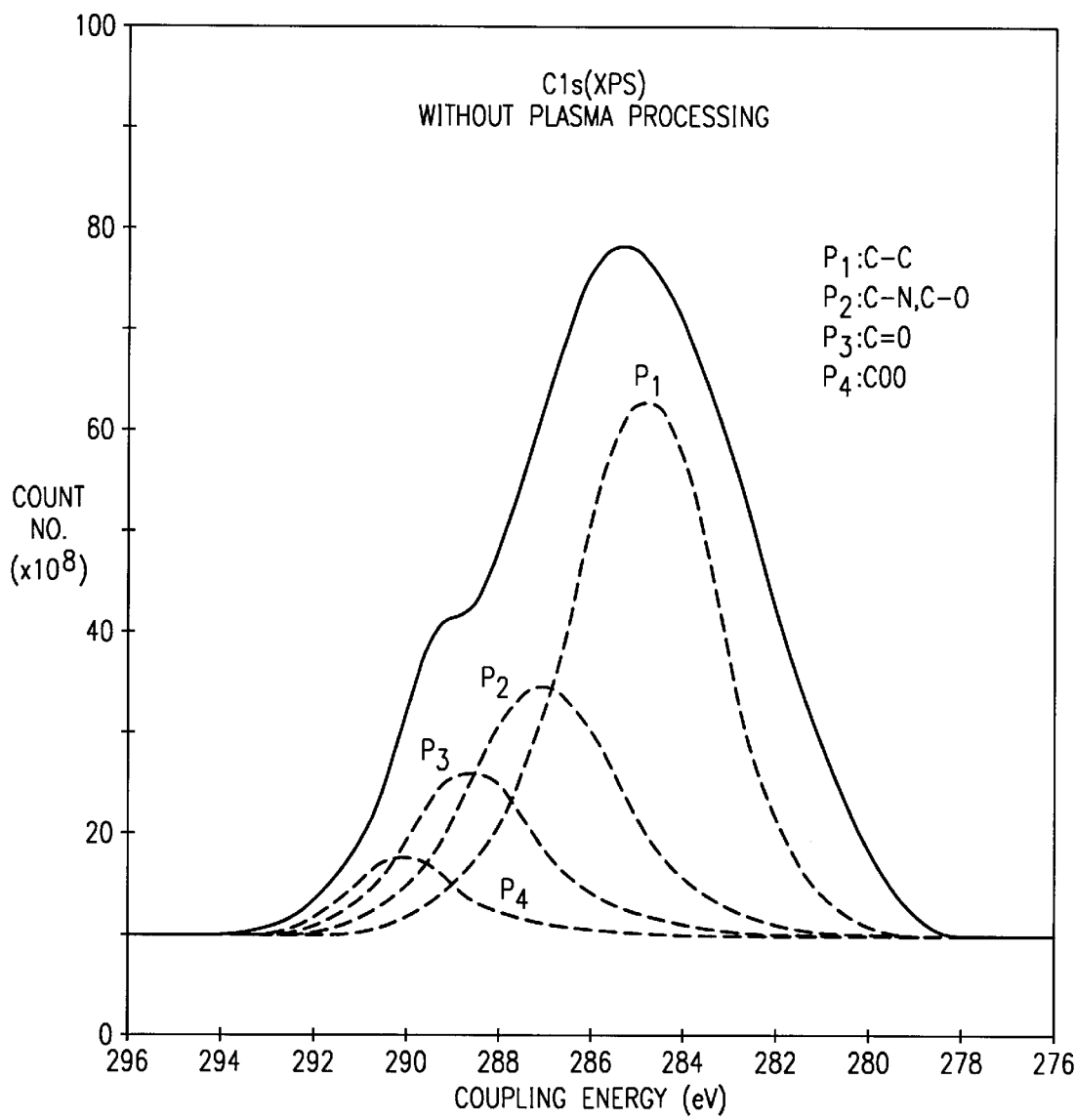
FIG. 21 is a spectral analysis graph based on an XPS of the polyimide resin (without plasma processing).
Figure 22:
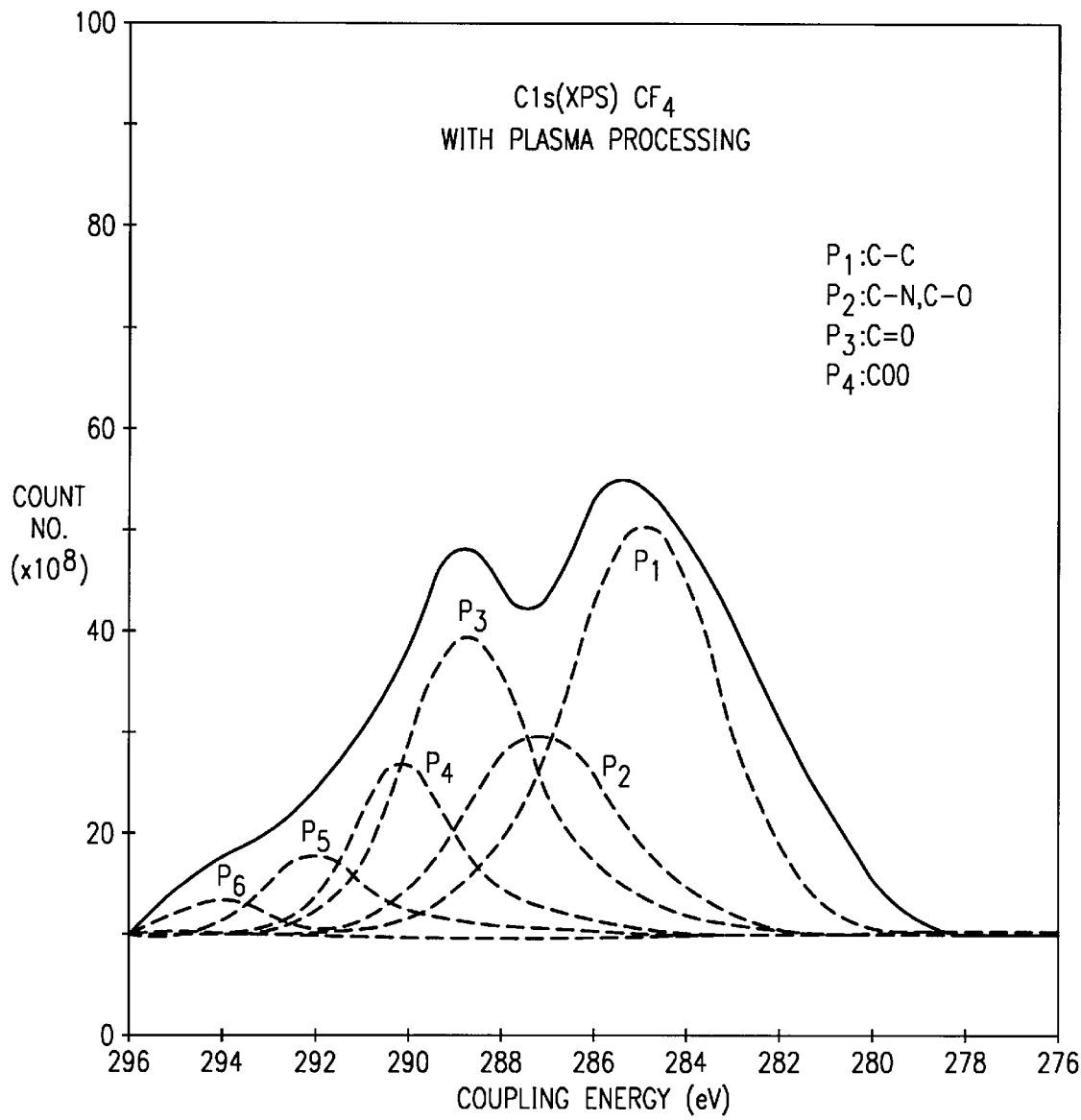
FIG. 22 is a spectral analysis graph based on an XPS of the polyimide resin (with plasma processing).
Figure 23:
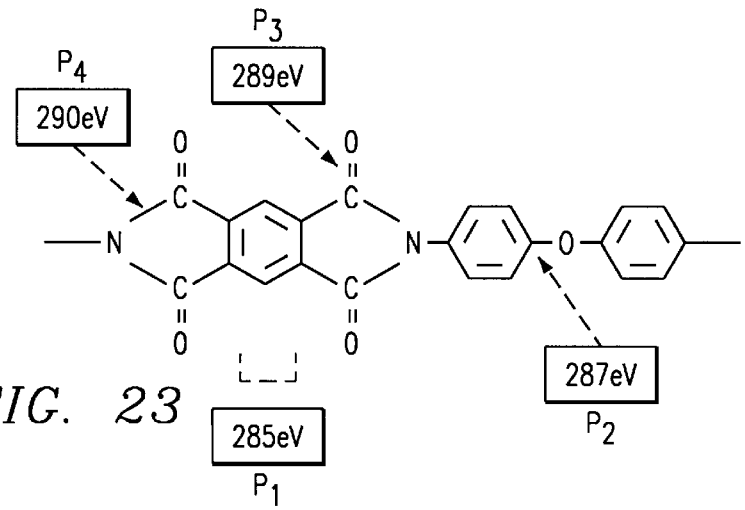
FIG. 23 is an explanatory drawing showing the assignment in this same XPS.
Figure 24A:
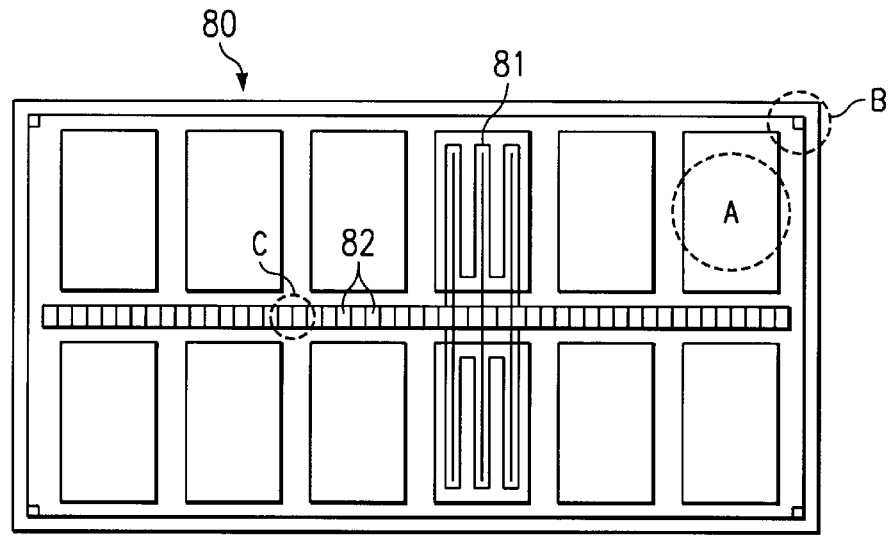
FIG. 24 is an abbreviated enlarged plane view of each section of abbreviated plane views of the test chips.
Figure 24B:
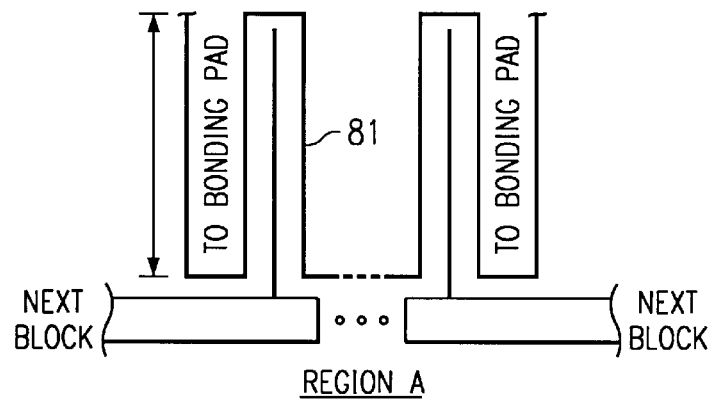
Figures 24C, 24D:
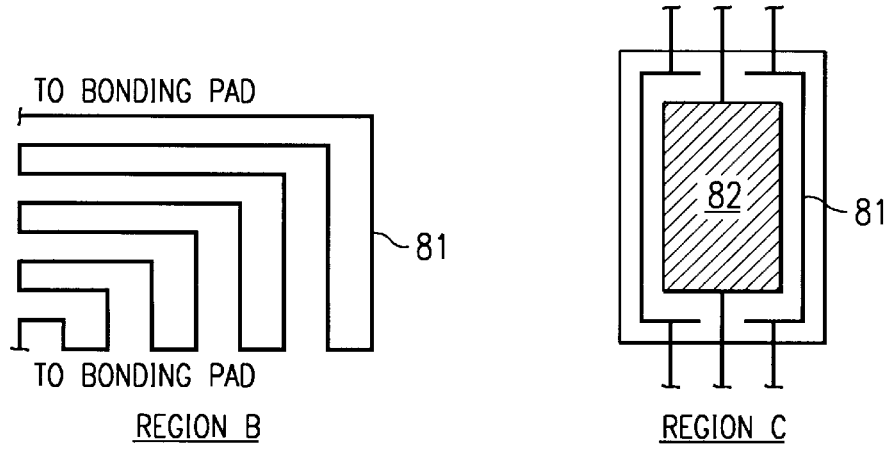
Figure 25:
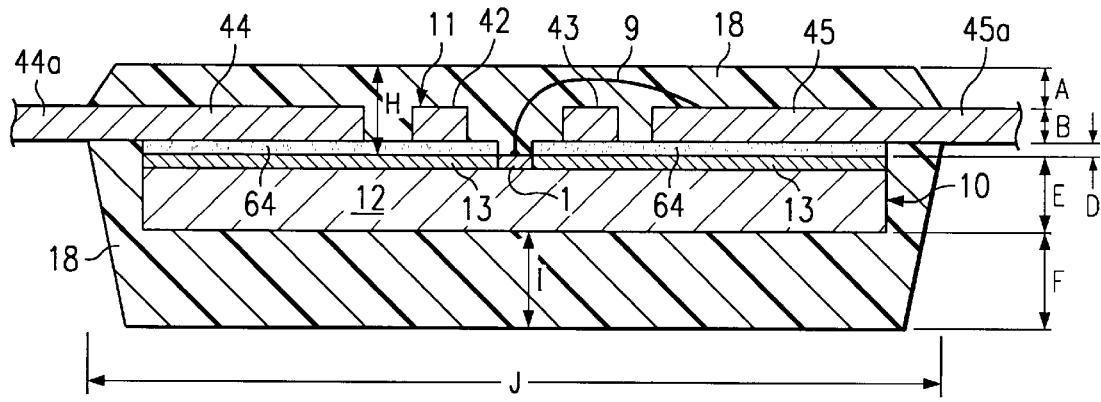
FIG. 25 is a cross-sectional view of an IC package of an LOC construction based on another embodiment of this invention.
Figure 26A:
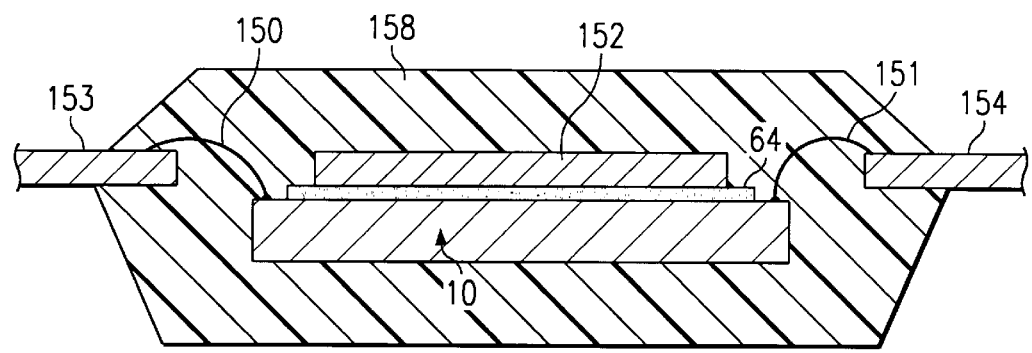
FIG. 26 is a cross-sectional view of an IC package based on another embodiment of this invention.
Figure 26B:
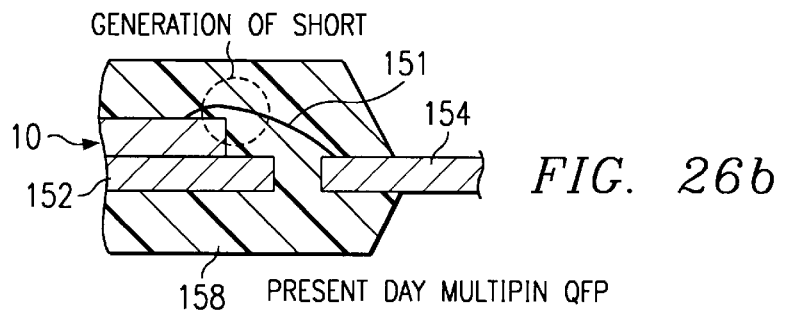
Figure 27:
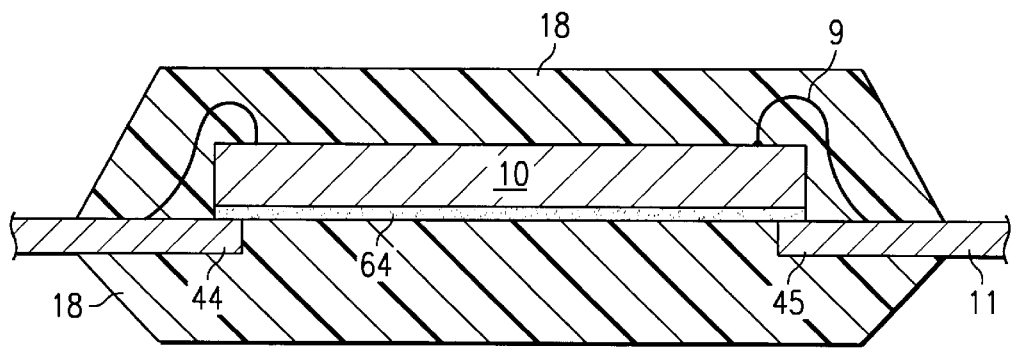
FIG. 27 is a cross-sectional view of an IC package of a COL construction based on yet another embodiment of this invention.
Figure 28:
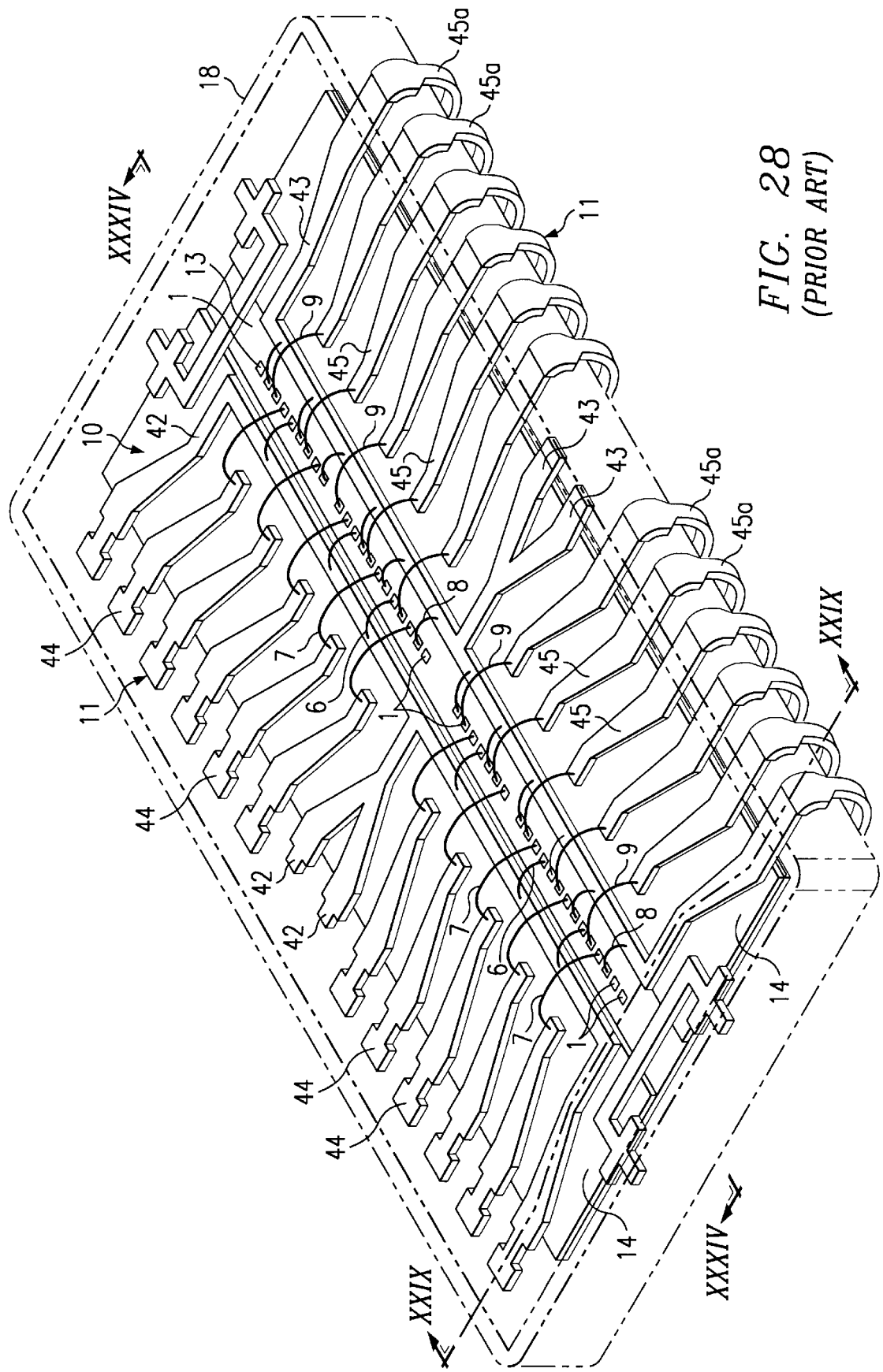
FIG. 28 is a perspective view of the main components of a package for an LOC construction used until now.
Figure 29:
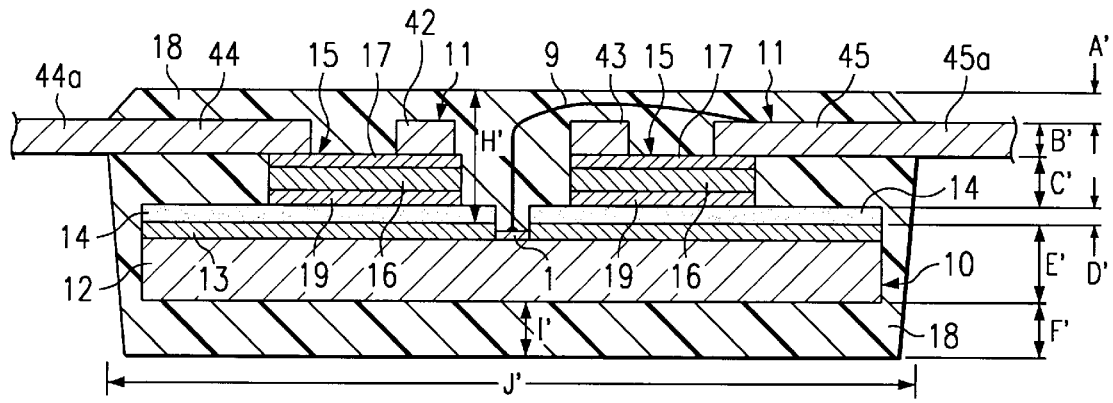
FIG. 29 is a cross-sectional view (of FIG. 28 through lines XXIX—XXIX) of this same package.
Figure 30:
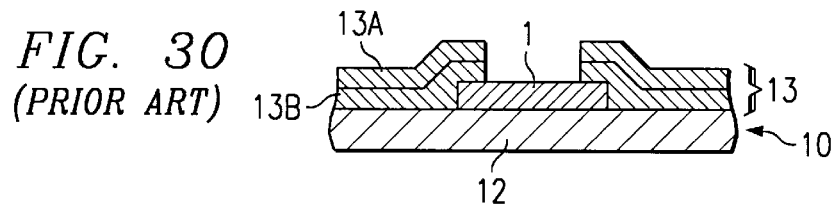
FIG. 30 is a cross-sectional view showing a process of the manufacturing method for this same package.
Figure 31:
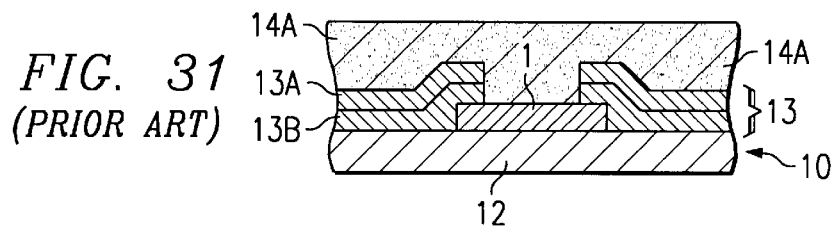
FIG. 31 is a cross-sectional view showing another process of the manufacturing method for this same package.
Figure 32:
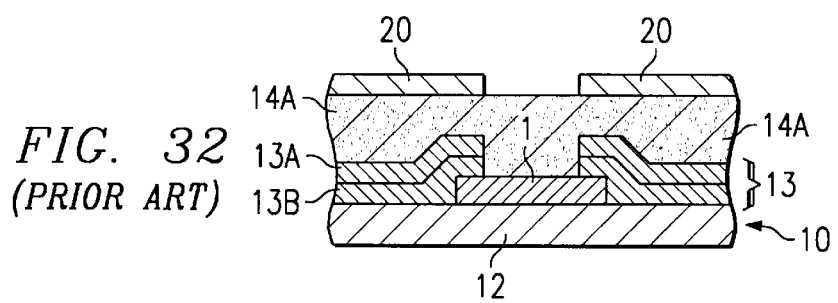
FIG. 32 is a cross-sectional view showing another process of the manufacturing method for this same package.
Figure 33:
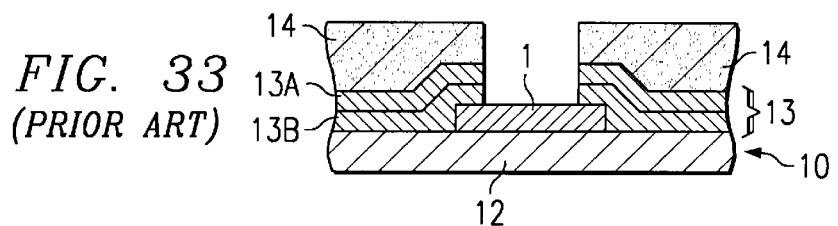
FIG. 33 is a cross-sectional view showing yet another process of the manufacturing method for this same package.
Figure 34:
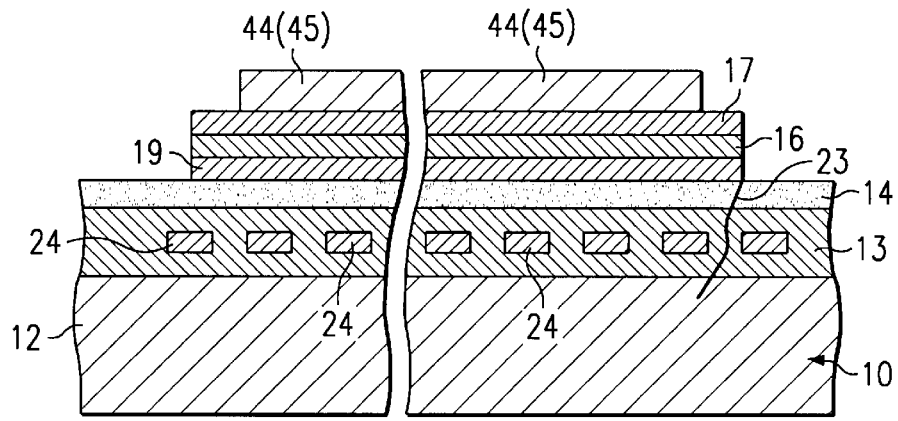
FIG. 34 is an enlarged cross-sectional view (of FIG. 28 through lines XXXIV—XXXIV) of the main components of this same package.
Figure 35:
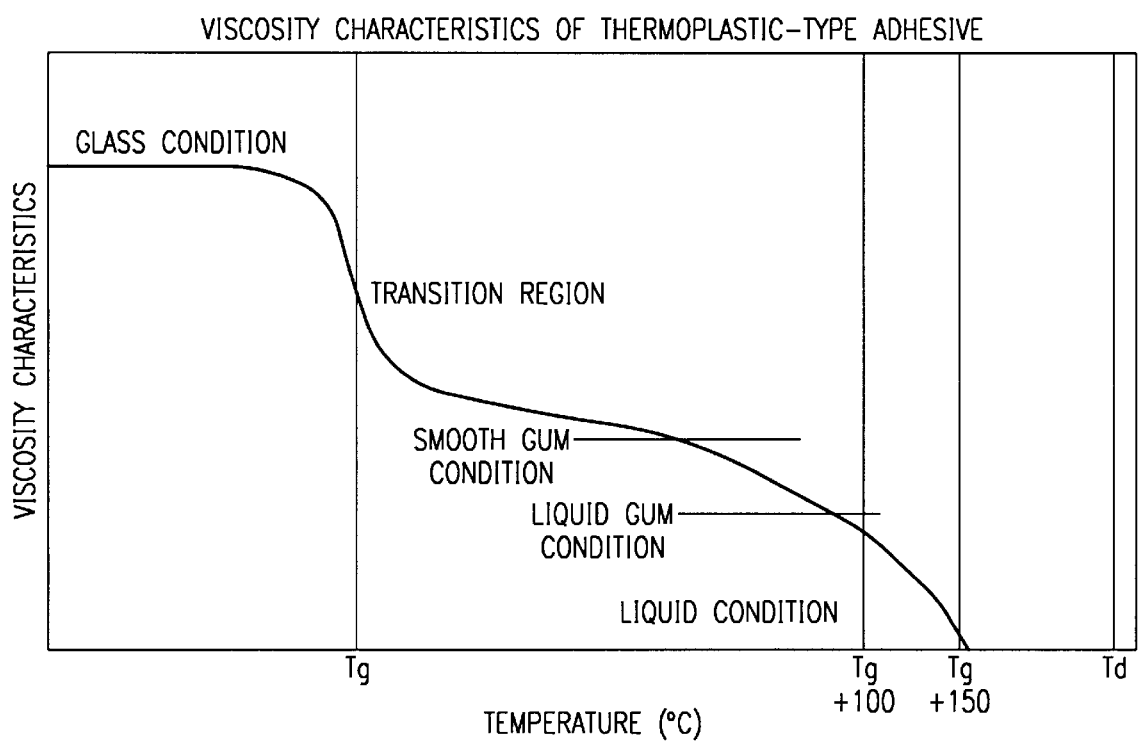
FIG. 35 is a graph showing the viscosity characteristics of the thermoplastic adhesive used in this same package.
Figure 36:
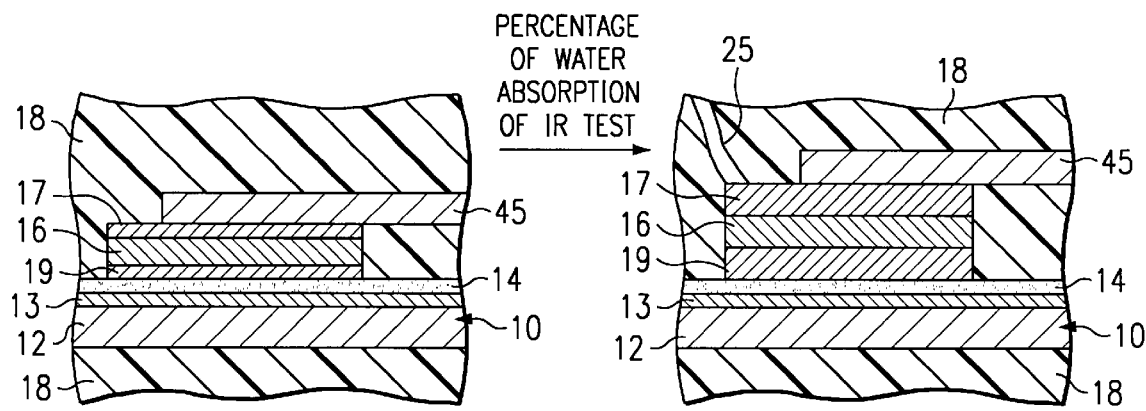
FIG. 36 is an enlarged cross-sectional view of the main components during the IR reflow tests for this same package.
Figure 37:
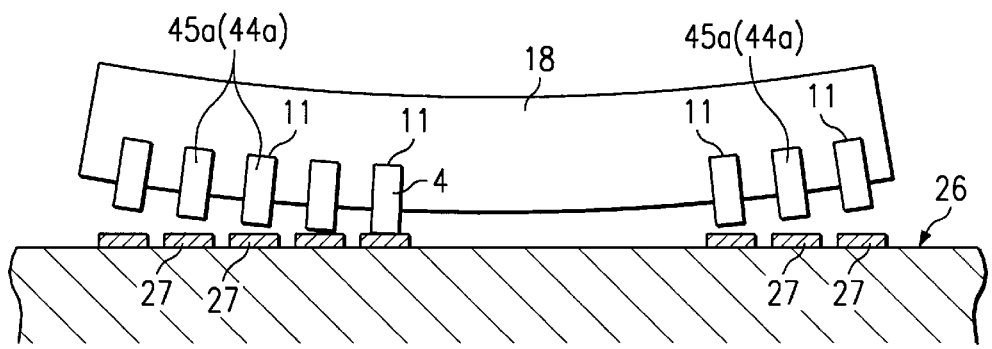
FIG. 37 is an abbreviated lateral view showing the warpage condition of this same package.
Figure 38:
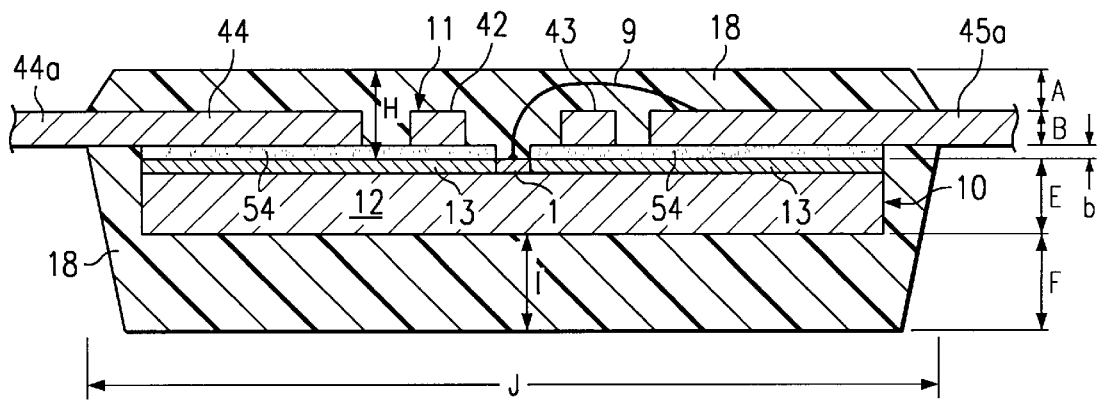
FIG. 38 is a cross-sectional view of an IC package of an LOC construction based on an embodiment of the invention of the previous application.
Figure 39:
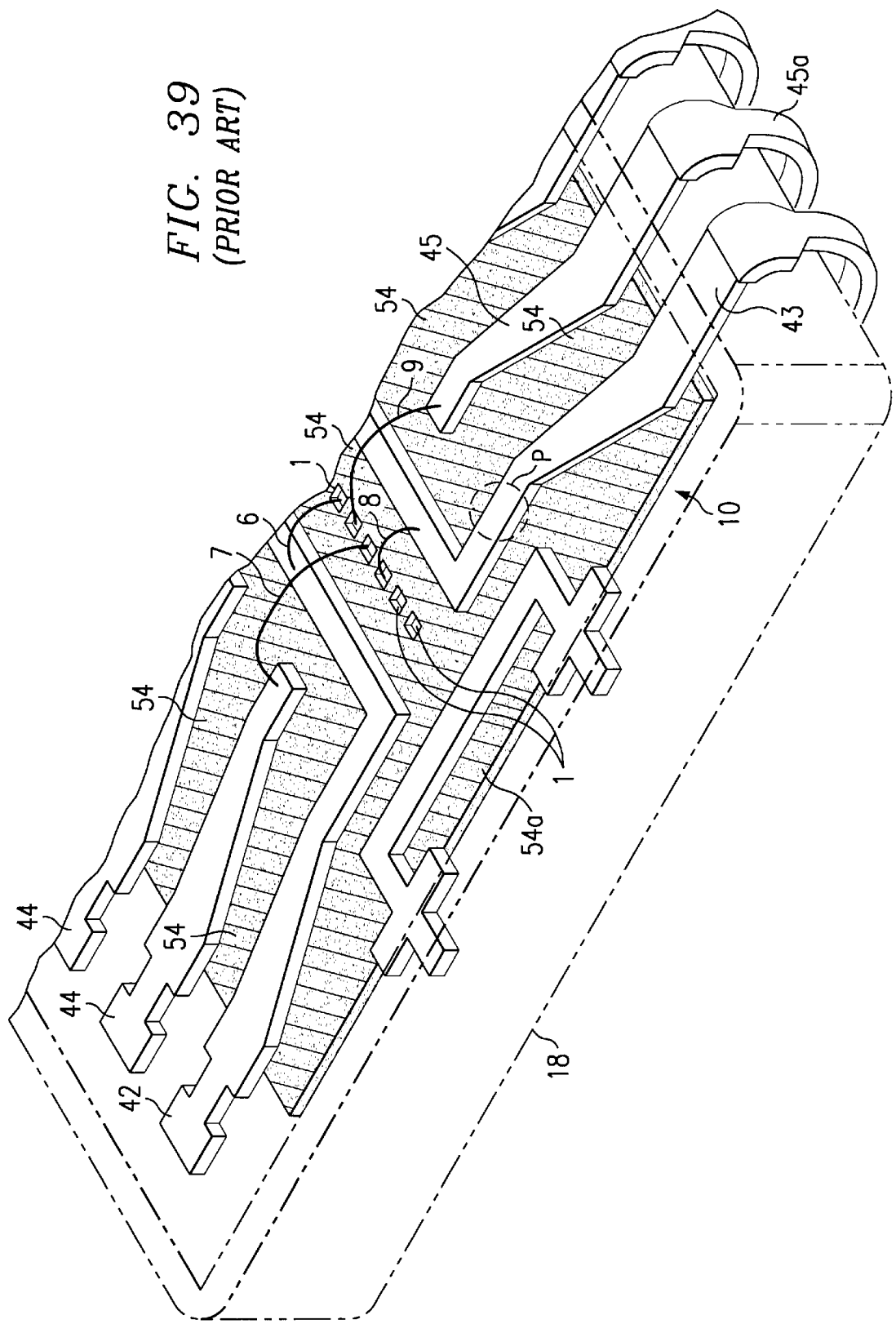
FIG. 39 is an enlarged perspective view of the main components of this same package.
Figure 40:
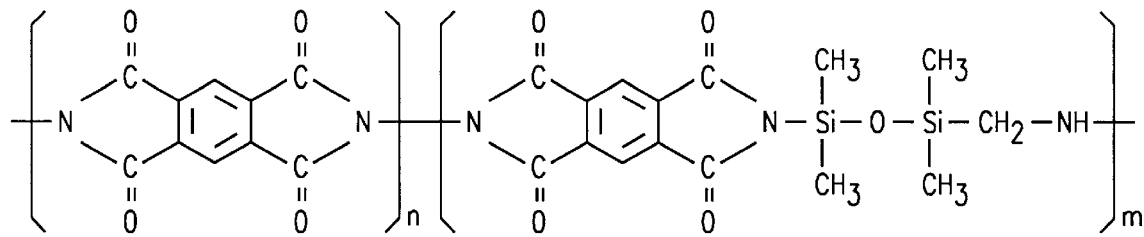
FIG. 40 is a drawing showing the construction formula for the thermoplastic polyimide resin used in this same package.
Figure 41:
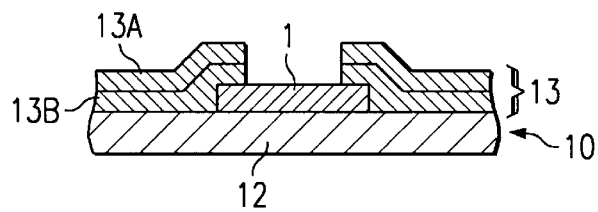
FIG. 41 is a cross-sectional view showing a process of the manufacturing method for this same package.
Figure 42:
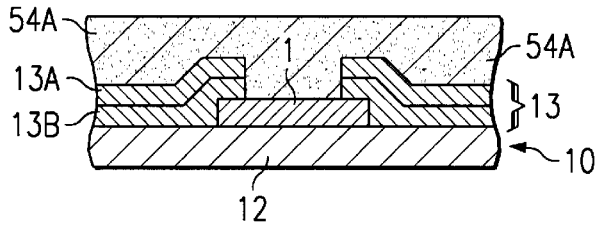
FIG. 42 is a cross-sectional view showing another process of the manufacturing method for this same package.
Figure 43:
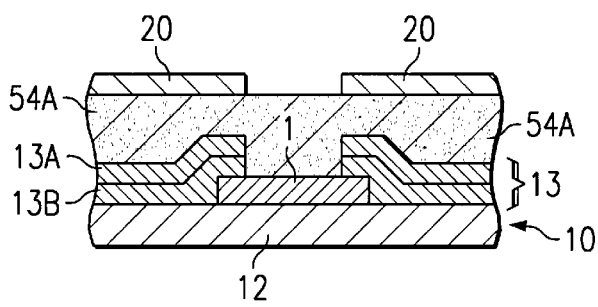
FIG. 43 is a cross-sectional view showing another process of the manufacturing method for this same package.
Figure 44:
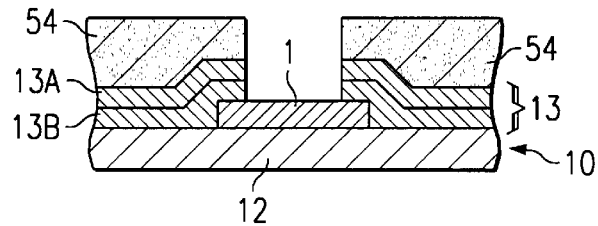
FIG. 44 is a cross-sectional view showing yet another process of the manufacturing method for this same package.
Figure 45A:
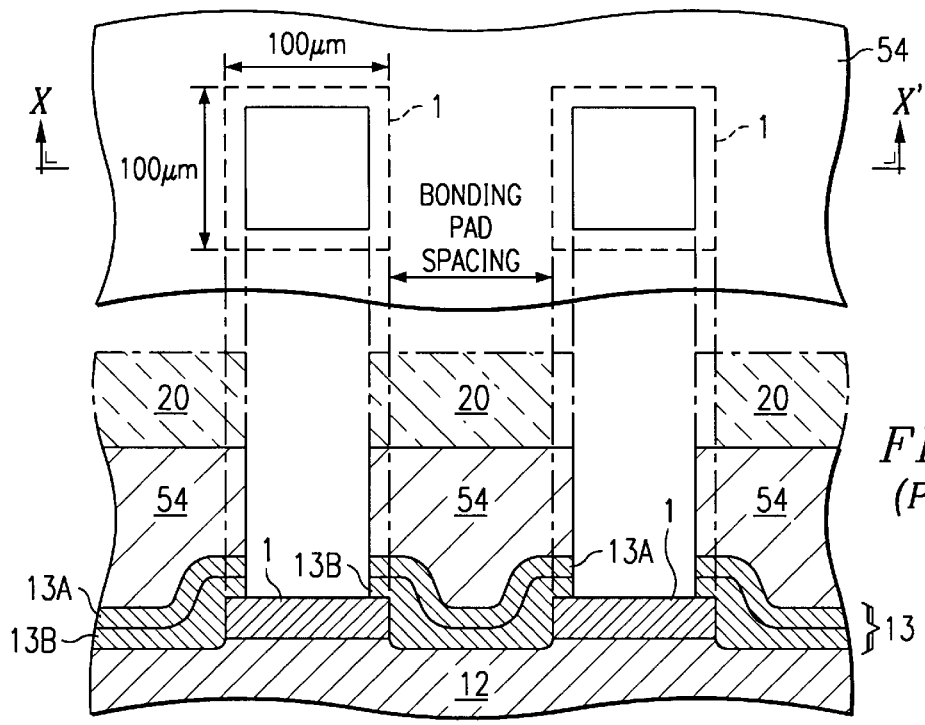
FIG. 45 is an enlarged cross-sectional view of a bonding pad section of this same package.
Figure 45B:
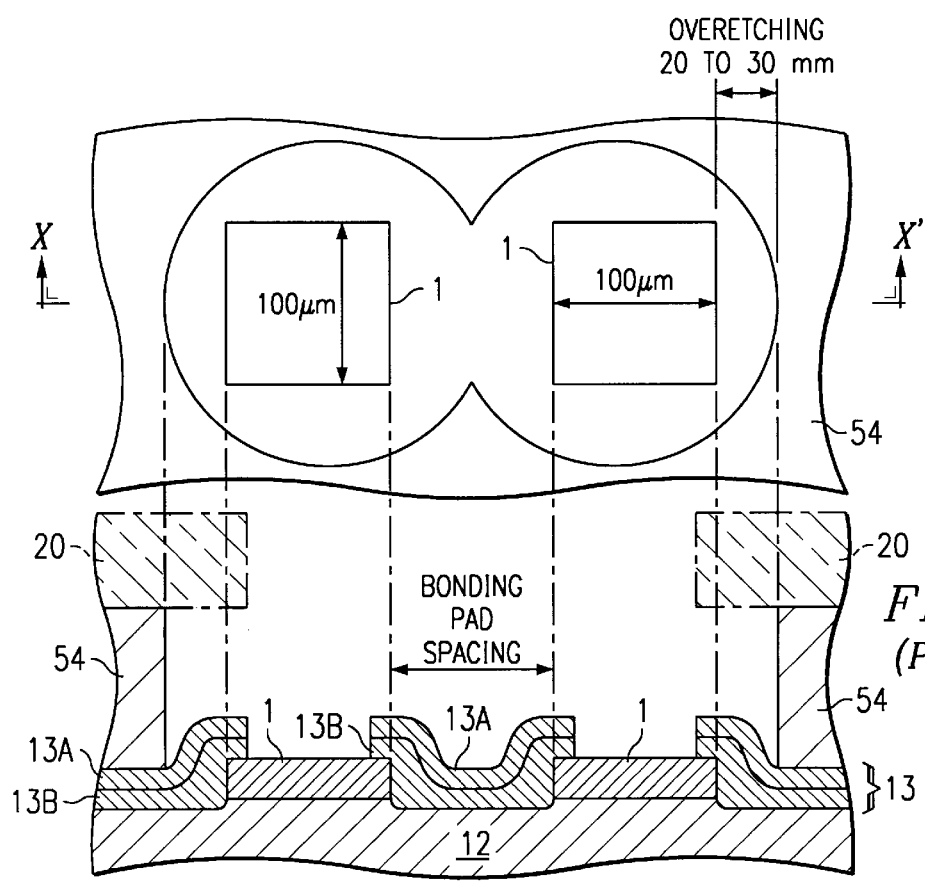

In the figures, 1 is a bonding pad, 6, 7, 8, 9 wires, 10 an IC chip, 11 a lead frame, 12 a silicon substrate, 13 a passivation film, 14 a thermosetting polyimide resin layer, 15 an insulating tape, 16 an insulating substrate, 15, 17 adhesives, 18 molding resin, 20 a photoresist etching mask, 42, 43 bus bars, 44, 45 signal lines, 54 a thermoplastic polyimide resin layer, 6 a photosensitive thermosetting polyimide resin layer, 70 an exposure mask, 71 ultraviolet rays, and 72 is a plasma.

I claim:

1. A semiconductor device comprising:
   a semiconductor chip having electrical circuits;
   a tapeless mounting for a lead frame comprising:
   a photosensitive insulating thermosetting resin layer affixed to the semiconductor chip and patterned to expose bond pad areas on the chip; and
   a lead frame affixed to the semiconductor chip by the photosensitive thermosetting, resin layer.

2. A semiconductor device comprising:
   a semiconductor chip having electrical circuits:
   a tapeless mounting for a lead frame comprising:
   a photosensitive thermosetting resin layer affixed to the semiconductor chip: and
   a lead frame affixed to the semiconductor chip by the photosensitive thermosetting resin layer, wherein the lead frame comprises an inner lead section, an outer lead section, and a support pin section, with only the support pin section affixed to the photosensitive thermosetting resin layer.

3. The device of claim 2 further comprising:
   a protective film on the semiconductor chip, on which the photosensitive thermosetting resin layer is disposed.

4. The device of claim 2 wherein the inner lead section is separated by placing it at a spacing of about 0.010 to 0.20 mm from the surface of the photosensitive thermosetting resin layer.

5. The device of claim 2 wherein the photosensitive thermosetting resin layer comprises a polyimide resin 20 to 40 μm thick.

6. The device of claim 5 wherein the glass transition point of the photosensitive thermosetting polyimide resin layer is 245–350° C.

7. The device of claim 5 wherein the surface roughness (Ra) of the photosensitive thermosetting polyimide resin layer is less than 3.0 nm.

8. The device of claim 2 wherein the semiconductor chip has bonding pads coupled to the electrical circuit, and the lead frame and the bonding pads are wire bonded in a region wherein the photosensitive thermosetting resin layer has been selectively removed and the semiconductor chip's entire body is sealed with a molding resin.

9. The device of claim 2 wherein the lead frame comprises a first lead frame section used for signal lines and a second lead frame section used for power supply lines.

10. A semiconductor device comprising:
    a semiconductor chip having electrical circuits;
    a tapeless mounting for a lead frame comprising:
    a photosensitive thermosetting resin layer affixed to the semiconductor chip; and
    a lead frame affixed to the semiconductor chip by the photosensitive thermosetting polyimide resin layer 20 to 40 μm thick, and having a glass transition point of 245–350° C.

* * * * *